(12) United States Patent
Hennig

(10) Patent No.: US 7,411,395 B2
(45) Date of Patent: Aug. 12, 2008

(54) APPARATUS AND METHOD FOR NMR TOMOGRAPHY ACQUISITION WITH LOCAL MAGNETIC FIELD GRADIENTS IN CONNECTION WITH LOCAL RECEIVER COILS

(75) Inventor: Jürgen Hennig, Freiburg (DE)

(73) Assignee: Universitätsklinikum Freiburg, Freiburg (DE)

( * ) Notice: Subject to any disclaimer, the term of this patent is extended or adjusted under 35 U.S.C. 154(b) by 17 days.

(21) Appl. No.: 11/584,857

(22) Filed: Oct. 23, 2006

(65) Prior Publication Data

US 2007/0090838 A1    Apr. 26, 2007

(30) Foreign Application Priority Data

Oct. 25, 2005   (DE) .................... 10 2005 051 021

(51) Int. Cl.
*G01V 3/00* (2006.01)
(52) U.S. Cl. ........................................ 324/307
(58) Field of Classification Search ......... 324/300–322; 600/410–435
See application file for complete search history.

(56) References Cited

U.S. PATENT DOCUMENTS

| | | | |
|---|---|---|---|
| 4,871,968 A | 10/1989 | Kanayama | |
| 5,530,354 A | 6/1996 | Herlihy et al. | |
| 6,255,821 B1 | 7/2001 | Oppelt | |
| 2004/0239325 A1 | 12/2004 | Hardy | |
| 2006/0066310 A1* | 3/2006 | Balcom et al. | 324/318 |

FOREIGN PATENT DOCUMENTS

| | | |
|---|---|---|
| DE | 38 28 718 A1 | 3/1989 |
| DE | 196 16 388 A1 | 11/1997 |
| DE | 198 43 463 A1 | 3/2000 |
| GB | 2 149 921 A | 6/1985 |

OTHER PUBLICATIONS

David J. Larkman; Amy H. Herlihy; Glyn A. Coutts; and Joseph V. Hajnal, "Elimination of Magnetic Field Foldover Artifacts in MR Images", Journal of Magnetic Resonance Imaging, vol. 12, pp. 795-797, Wiley-Liss, Inc., 2000.

(Continued)

*Primary Examiner*—Brij B Shrivastav
*Assistant Examiner*—Dixomara Vargas
(74) *Attorney, Agent, or Firm*—Walter A. Hackler

(57) ABSTRACT

A magnetic resonance tomography apparatus, includes a gradient system that can generate at least one spatially varying and optionally time-varying magnetic field for at least one-dimensional local encoding of measuring signals in an area of a test sample to be imaged. The gradient system contains at least one subsystem which can generate a non-bijective spatially varying magnetic (NBSEM) field for local encoding, such that the function of the field strength of such an NBSEM within the area to be imaged has at least one local extreme value (maximum or minimum), such that the area to be imaged is divided along the hyper surface formed by the entirety of all local extreme values of the at least one NBSEM. The apparatus can produce images of the same quality with smaller magnetic field differences and permits easy realization.

24 Claims, 13 Drawing Sheets

OTHER PUBLICATIONS

Magnetic Resonance Imaging, Ed.MT Vlaardingerbroek, Springer-Verlag, 1999, ISBN 3-540-64877-1.

Roland Bammer and Stefan O. Schoenberg, "Current Concepts and Advances in Clinical Parallel Magnetic Resonance Imaging", Jun. 2004, pp. 129-158, vol. 15, No. 3, Lippincott Williams & Wilkins.

Martin Blaimer, Felix Bruer, Matthaias Mueller, Robin M. Heidemann, Mark A. Gristwold, and Peter M. Jakob, "Smash, Sense, Pils, Grappa How to Choose the Optimal Method", Top. Magn Reson Imaging, Aug. 2004, pp. 223-236, vol. 15, No. 4, Lippincott Williams & Wilkins.

David J. Larkman, David Atkinson, Jo V. Hajnal, "Artifact Reduction Using Parallel Imaging Methods", Top Magn Reson Imaging, Aug. 2004, pp. 267-275, vol. 15, No. 4, Lippincott Williams & Wilkins.

David Atkinson, David J. Larkman, Philipp G. Batchelor, Derek L.G. Hill, and Joseph V. Hajnal, "Coil-Based Artifact Reduction", Magnetic Resonance in Medicine, 2004, pp. 825-830, 52, Wiley-Liss, Inc.

David J. Larkman, Amy H. Herlihy, Glyn A. Coutts, Joseph V. Hajnal, "Elimination of Magnetic Field Foldover Artifacts", Journal of Magnetic Resonance Imaging, 2000, pp. 795-797, 12, Wiley-Liss, Inc.

Jeffrey Tsao, Peter Boesiger, and Klaas P. Pruessmann, "k-t BLST and k-t Sense: Dynamic MRI With High Frame Rate Exploiting Spatiotemporal Correlations", Magnetic Resonance in Medicine, 2003, pp. 1031-1042, 50, Wiley-Liss, Inc.

Cynthia Maier, Kenneth C. Chu, Blaine A. Chronik, Brian K. Rutt, "A Novel Transverse Gradient Coil Design for High-Resolution MR Imaging", Magnetic Resonance in Medicine, 1995, pp. 604-611, 34, Williams & Wilkins.

Rostislav Lemdiasov, Reinhold Ludwig, Mat Brevard, Craig Ferris, "Design and Implementation of a Uniplanar Gradient Field Coil for Magnetic Resonance Imaging", Concepts in Magnetic Resonance Part B, 2004, pp. 17-29, vol. 20B(1), Wiley Periodicals, Inc.

D.L. Parker and J.R. Hadley, "Gradient Arrays for High Performance Multiple Region MRI", Proc. Intl. Soc. Mag. Reson. Med. 14th Meeting ISMRM, Seattle, p. 521 (2006).

* cited by examiner

Fig.2A
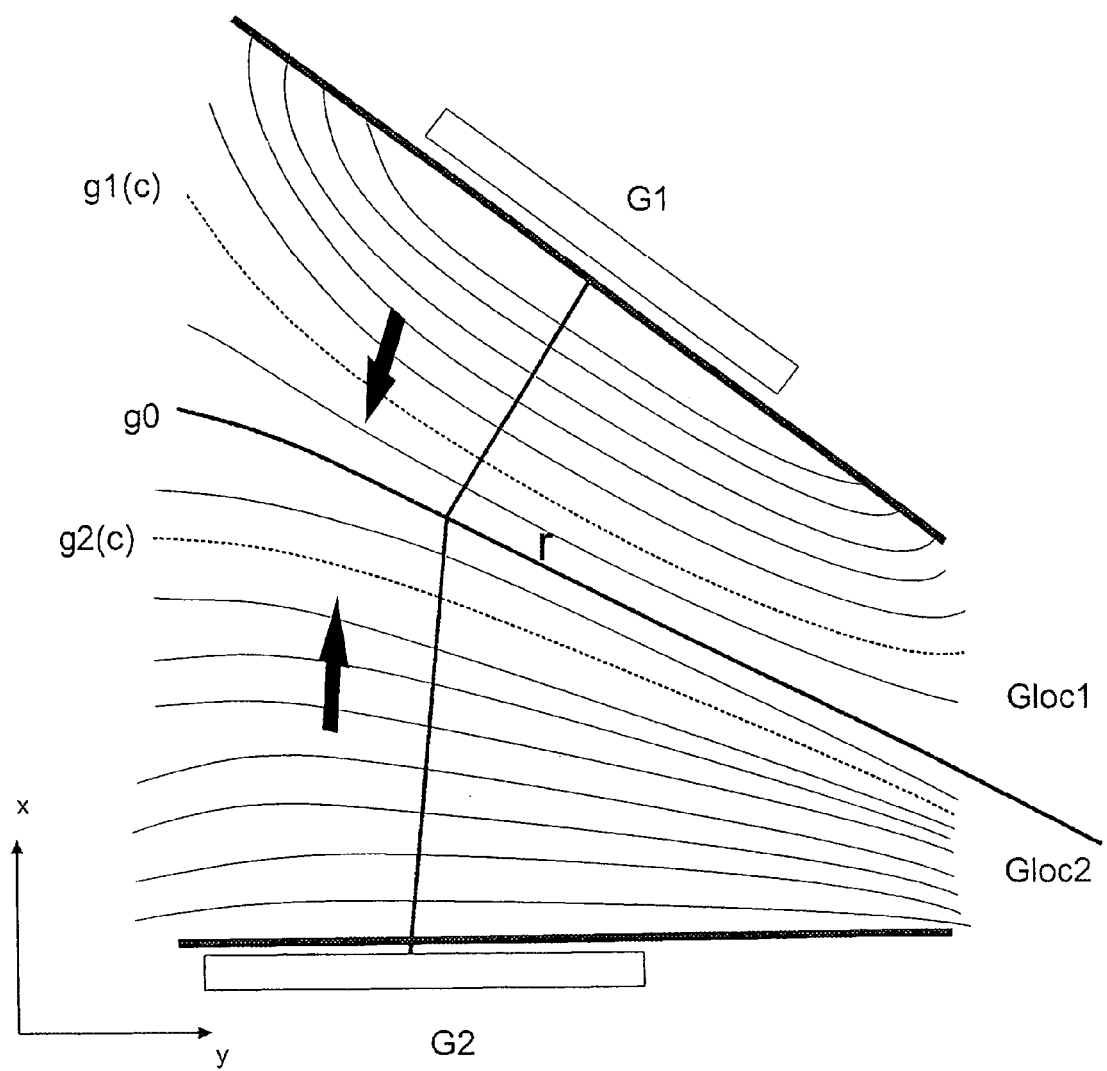
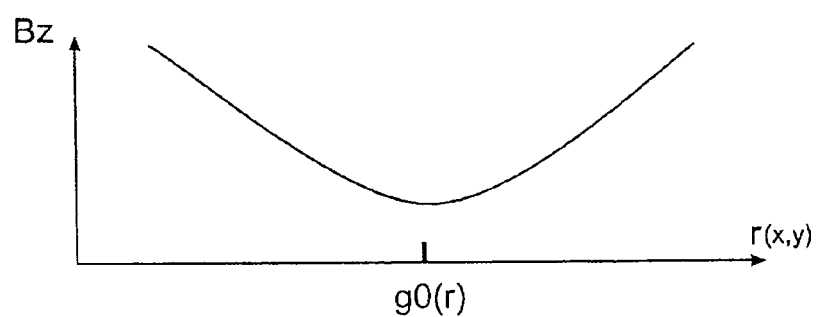

Fig.2B
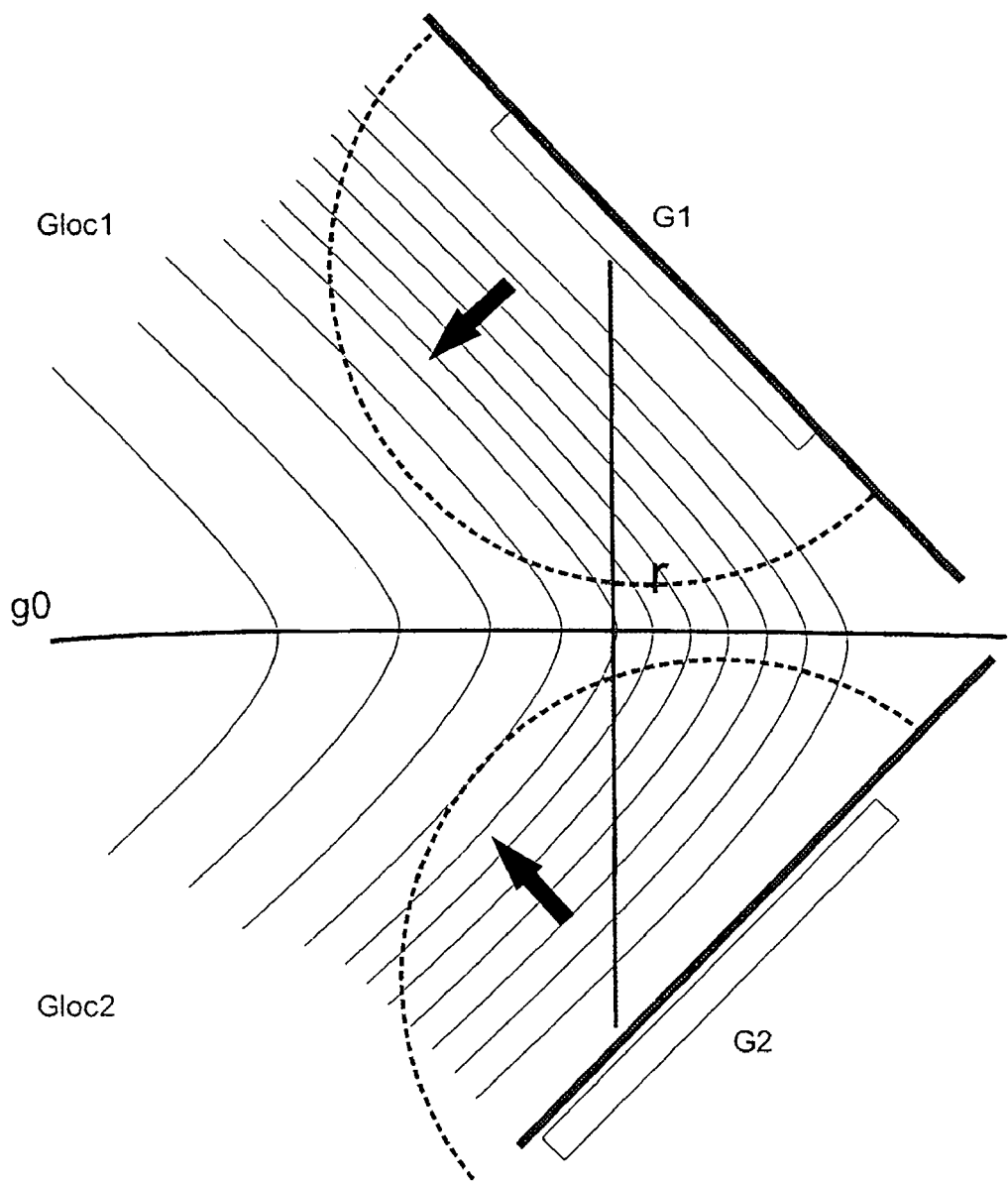
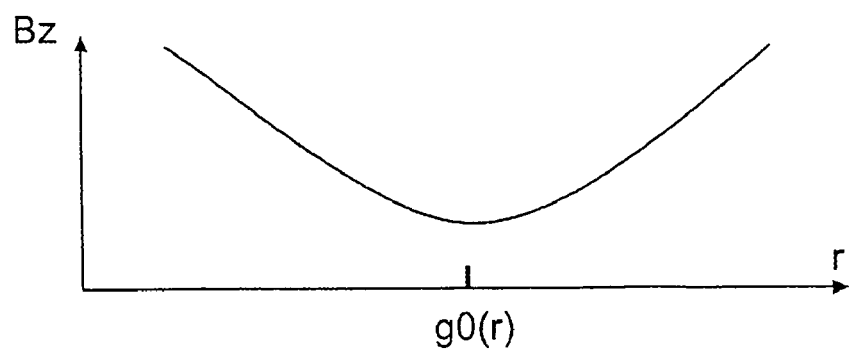

APPARATUS AND METHOD FOR NMR TOMOGRAPHY ACQUISITION WITH LOCAL MAGNETIC FIELD GRADIENTS IN CONNECTION WITH LOCAL RECEIVER COILS

BACKGROUND OF THE INVENTION

The invention concerns a magnetic resonance tomography apparatus comprising a gradient system that can generate at least one spatially varying and optionally time-varying magnetic field for at least one-dimensional local encoding of measuring signals in an area of a test sample to be imaged.

A magnetic resonance tomography apparatus of this type is disclosed e.g. in "Magnetic Resonance Imaging", Ed. MT Vlaardingbroek, Springer-Verlag.

In NMR tomography, the properties of atomic nuclei, in particular 1H nuclei, are utilized for imaging. The nuclear spins are excited in a test sample, which is located in a strong static magnetic field, by suitable RF (radio frequency) pulses, and the RF response of the atomic nuclei is read-out using suitable receiver coils Encoding methods are used to associate a measuring signal with a location in the test sample. In particular, magnetic fields with a field strength which monotonically (and usually linearly) varies at least in one direction across the entire test sample are thereby used ("conventional gradients"). The local magnetic field strength determines the local Larmor frequency. The Larmor frequency can be uniquely associated with the location in the test sample for monotonic encoding field distributions. The local resolution and the measuring time depend on the gradient strength (steepness of the magnetic field). Since several conventional gradients have to be used successively for local encoding in more than one dimension, these magnetic fields must moreover be switched very quickly. The interaction with the main field of the magnet generates Lorentz forces.

One disadvantage of this prior art is that the rapidly changing Lorentz forces, that are generated in particular in larger areas of a test sample to be imaged when the monotonically extending conventional gradients rapidly change, produce a substantial mechanical load, and the deformation caused by these forces generates substantial noise of typically 100 dBA or more.

The gradient strength which is required to obtain typical local resolution and measuring time causes enormous differences in the magnetic field at the edge of the area to be imaged. Rapidly changing magnetic field strengths may stimulate a patient's neurons in medical applications, such that the measuring time of an NMR acquisition using conventional gradients is eventually limited by physiological factors (noise, neuronal stimulation).

Neuronal stimulations can be minimized using local gradient systems, in which a strong gradient acts only on a short path in each case, such that the local change of the field dB/dt which is relevant for the stimulation is small. However, such local gradient systems produce strong mechanical interaction with the main field causing very strong vibration and hence increased noise.

One further conventional method suggests a gradient which is periodically amplitude-modulated along at least one spatial direction (Oppelt. A. DE 198 43 463 A1). Alternation of the gradient along at least one spatial direction reduces the local field change dB/dt which is relevant for neuronal stimulation and moreover due to the opposing forces acting in alternating gradient fields, the mechanical force and thereby the noise are at least partially reduced. One practical problem with this concept is, however, that alternation of a gradient along one direction can be realized only with magnetic field coils having a very complex construction, such that practical realization of such a gradient system has been possible only for a short time (Dennis L. Parker, J. Rock Hadley, Gradient Arrays for High Performance Multiple Region MRI. Proc. 14th Meeting ISMRM, Seattle, p. 521 (2006)). The generation of a gradient field which is unidirectional within the target volume used for the image, requires a very complex current profile, when realized with a system of a final size which is dimensioned for installation in an MR magnet, due to the mathematical structure of the Biot-Savart equations.

OBJECT OF THE INVENTION

In contrast thereto, it is the underlying purpose of the present invention to provide a magnetic field resonance tomography apparatus which produces images of the same quality with smaller magnetic field differences in the area to be imaged, in particular wherein the mechanical forces acting on the apparatus are reduced, permitting faster switching times for the locally encoding magnetic fields. The apparatus should moreover be easy to realize.

SUMMARY OF THE INVENTION

This object is achieved by an NMR tomography apparatus of the above-mentioned type, which is characterized in that the gradient system contains at least one subsystem which can generate a non-bijective, spatially varying magnetic field (NBSEM or ambivalent/non-bijective spacially encoding magnetic field) for local encoding, such that the function of the field strength of such an NBSEM within the area to be imaged has at least one local extreme value (maximum or minimum), such that the area to be imaged is divided along the hyper surface formed by the entirety of all local extreme values of the at least one NBSEM, into ng partial areas, with ng$\geq$2, that the magnetic field profile has a non-unidirectional distribution within and/or over these partial areas, and that at least ng receiver coils are provided which have a differing sensitivity in these partial areas.

Thus, the basic idea of this invention is to use a magnetic field which is only locally bijective and has a curved field distribution for local encoding instead of a unidirectional magnetic field which is bijective over the entire area to be imaged (i.e. which can be uniquely associated, and generally extends in a linear or at least monotonic fashion). The magnetic field along a local direction within the area to be imaged in an NBSEM does not extend monotonically, which eliminates on the one hand the inevitable areas of high field changes in the edge area of monotonically varying fields, and the associated disadvantages as described above. On the other hand, the Lorentz forces which are generated in non-monotonic fields, act in different and at least partially opposite directions, and therefore compensate each other, at least partially. Such non-monotonic, non-unidirectional magnetic fields lead to a non-unique association of the Larmor frequency with a location. The resulting ambivalence in local association is eliminated by additional information about the location of receipt of a signal by the associated receiver coil with local sensitivity. The area to be imaged is divided into several small partial areas, in which parallel measurements are carried out. Within the smaller partial areas, the steepness of the magnetic field gradient for local encoding, as determined by the acquisition parameters, leads to relatively small magnetic field differences.

Compared to unidirectional gradient systems, the invention allows a much less restricted and in particular simpler construction of an NMR tomography apparatus.

In a preferred embodiment of the inventive apparatus, the gradient field associated with the NBSEM has a substantially unidirectional distribution within each partial area, whose direction varies, however, in different partial areas, such that the overall gradient field generated by this NBSEM has a curved distribution. The overall apparatus, consisting of a gradient system which can generate such an NBSEM and ng receiver coils, is called Patloc type 1 (see below). Due to the unidirectional distribution in individual partial areas, such systems can be used very easily in combination with conventional gradients.

In another preferred embodiment, the gradient field associated with the NBSEM also has a non-unidirectional (curved) distribution within at least one partial area. The overall apparatus which consists of a gradient system which can generate such an NBSEM and ng receiver coils, is called Patloc type 2 (see below). Patloc type 2 systems allow very flexible optimization of the geometry of the local encoding fields relating to the field of application, and require more effort to correct distortions of the obtained image compared to Patloc type 1 systems.

In one particularly preferred embodiment, at least one further subsystem is provided for further local encoding within the area to be imaged, which can generate a further NBSEM, in particular wherein the local field gradient of the further NBSEM is approximately perpendicular to the local field gradient of the first NBSEM at every location of the area to be imaged. Each NBSEM can locally encode in one dimension. The advantages of the invention can thereby be utilized in several dimensions.

In another preferred embodiment, the gradient system contains at least one further subsystem which can generate a conventional gradient corresponding to a monotonically spatially varying magnetic field (=MSEM, monotonic spacially encoding magnetic field) for further local encoding in one local direction in the area to be imaged, wherein the MSEM has a monotonic field strength distribution in its associated local direction in the area to be imaged. A conventional gradient is particularly suited for a local direction of small extension of the volume to be imaged, where the problems due to large magnetic field differences are not relevant. Each NBSEM or MSEM permits one local encoding in one dimension. For this reason, 1 to 3 SEM (NBSEM or MSEM) are typically used for 1 to 3-dimensional local encoding. It may, however, be advantageous to realize devices with several subsystems to generate several NBSEMs of different field distributions for a flexible scope of application.

In one further preferred embodiment, the subsystem for generating the at least one NBSEM has stationary conductor loops which can be separately controlled, such that not only the amplitude but also the shape of the NBSEM can be varied through varying the current strength and current direction in the conductor loops. This embodiment can generate different NBSEMs in temporal succession with a small number of apparatuses.

In another preferred embodiment, the subsystem for generating the at least one NBSEM comprises at least ng spatially separate gradient partial systems which lead to 1-, 2- or 3-dimensional local encoding in the respective local coordinate system of the respective gradient partial system, depending on the overall number 1, 2 or 3 of NBSEMs and MSEMs used. This embodiment can also generate NBSEM geometries that are more complex. The separate gradient partial systems can be operated by one common current source.

In one particularly preferred embodiment, the gradient system for local encoding can generate at least two NBSEMs with complementary field distribution, such that, in the area of local extreme values of one NBSEM, the other NBSEM has a steep and approximately linear field distribution and vice versa, such that every location within the area to be imaged is in the area of a steep and approximately linear field distribution of at least one of the used NBSEMs. The two complementary NBSEMs are applied successively. This embodiment prevents imaging gaps at the locations of extreme field values of an individual NBSEM in the overall image.

In one preferred further development of this embodiment, the units generating the NBSEM are constructed such that the NBSEMs, each having a complementary field distribution, can be generated through varying the current strength and current direction in the units generating the NBSEM. The units generating the NBSEMs are typically conductor loops of a subsystem or separate gradient partial systems of a subsystem. This embodiment permits generation of both complementary NBSEMs with a particularly small apparative effort.

In one further preferred embodiment, an NBSEM is generated whose associated gradient field has an approximately radial geometry, i.e. is oriented towards a center. This embodiment is particularly suited for local encoding perpendicularly to the surface of the test sample, in particular if the surface of the test sample is substantially convex such as e.g. a human head. The depth encoding caused by the radial geometry is already sufficient for many applications for investigating objects which are radially symmetric, such that with such a device very efficient methods with only one-dimensional local encoding can be realized.

In a preferred, alternative embodiment, an NBSEM may be generated, whose associated gradient field has an approximately tangential geometry, i.e. is oriented perpendicular with respect to a center direction at least in partial areas. Fields of this type can be generated with good linearity. Fields having a tangential geometry can be realized only over a limited partial periphery due to consistency. Local encoding with tangential gradients is advantageous for effective segmental encoding in many applications on radially symmetrical objects.

In another preferred embodiment, the units generating the NBSEM with combination of NBSEM of radial and tangential geometry are arranged such that local magnetic fields of a pseudo-Bessel geometry can be generated. This embodiment facilitates generation of complementary NBSEMs.

In an advantageous embodiment, each receiver coil has a sensitivity that significantly differs from zero in only one of the ng partial areas, and has a negligible sensitivity in the other partial areas. Allocation of the location, in particular of the partial area, to a measuring signal is particularly facilitated in this embodiment.

The present invention also comprises a method for performing a locally resolved NMR tomography experiment, wherein transverse magnetization is generated by at least one RF pulse with a frequency that corresponds to the Larmor frequency of the spins under investigation, said transverse magnetization is locally encoded in at least one dimension through application of at least one spatially and optionally time-varying magnetic field in an area of a test sample to be imaged, which is characterized in that at least one non-bijective spatially varying magnetic field (NBSEM, or ambivalent/non-bijective spacially encoding magnetic field) is applied for local encoding, such that the function of the field strength of such an NBSEM has at least one local extreme value (maximum or minimum) within the area to be imaged, such that the area to be imaged is divided along the hyper surface formed by the entirety of all local extreme values of the at least one NBSEM, into ng partial areas, with ng≧2, wherein the magnetic field profile has a non-unidirectional distribution within and/or over these partial areas, that the signal is read-out using at least ng receiver coils, which have a different sensitivity in the ng partial areas, and that the acquired data is uniquely allocated with respect to the location in the area to be imaged using algorithms of parallel reconstruction. The inventive method considerably reduces the magnetic field differences in the locally encoding magnetic field, at the same time obtaining the same image quality. The inventive method and its method variants described below can be performed with an apparatus in accordance with the invention as described above or with any embodiment thereof.

Method variants are preferred, wherein the NBSEM is used in a method based on local encoding in accordance with n-dimensional Fourier transformation. The NBSEM thereby replaces a conventional gradient. Another preferred method variant uses NBSEMs which are utilized to reconstruct the image in accordance with one of the methods for 2- or 3-dimensional local encoding according to the filtered back projection method. These variants are particularly suited for the practical implementation of the invention.

In a preferred variant of the inventive method, at least one further NBSEM is used for further local encoding within the area to be imaged, in particular wherein the local field gradients of all NBSEMs are approximately perpendicular relative to each other at every location of the area to be imaged. The advantages of the inventive method are thereby utilized in several ways.

Alternatively or additionally, in a preferred method variant, a conventional gradient corresponding to a monotonically spatially varying magnetic field (MSEM, monotonic spacially encoding magnetic field) is applied in at least one further local direction for further local encoding in this local direction in the area to be imaged, wherein the MSEM has a monotonic field strength distribution in its associated local direction in the area to be imaged. An MSEM permits simple encoding in one further dimension.

One method variant is particularly preferred, wherein the partial images which are separately reconstructed for each partial area, are transferred into a common, consistent coordinate system, taking into consideration the known geometry and imaging parameters in each partial area. This yields an overall image which can be directly conceived and evaluated.

In a preferred method variant, the ng local magnetic fields generated by the NBSEM differ in at least two of the ng partial areas, in particular, in view of strength and/or the respective geometrical arrangement as regards direction and/or location. The imaging parameters of the acquisition can thereby be flexibly adjusted to the local requirements.

In another preferred method variant, at least one NBSEM has a bimodal field distribution for local encoding, wherein the partial images acquired using this bimodal field distribution have an almost mirror-symmetrical geometry and are distinguished in correspondence with the different sensitivity profiles of the applied receiver coils. The bimodal field distribution reduces mechanical forces.

In one particularly preferred method variant, at least two NBSEMs of complementary field distribution are used for local encoding, such that in the region of local extreme values of one NBSEM, the other NBSEM has a steep and approximately linear field distribution, and vice versa, and wherein the data is acquired with each of the two complementary NBSEMs in separate acquisition steps. The complementary NBSEMs avoid imaging gaps at the locations of extreme field values of one of the NBSEMs.

A preferred further variant of the inventive method uses an NBSEM whose associated gradient field is orthogonal or approximately orthogonal to the curved surface of the test sample. This readily provides information from the depth of the test sample.

Another preferred method variant uses an NBSEM whose associated gradient field extends parallel or approximately parallel to the curved surface of the test sample, which yields segmental information in a particularly effective fashion.

Further advantages of the invention can be extracted from the description and the drawing. The features mentioned above and below may be used in accordance with the invention either individually or collectively in arbitrary combination. The embodiments shown and described are not to be understood as exhaustive enumeration but have exemplary character for describing the invention.

BRIEF DESCRIPTION OF THE DRAWINGS

The invention is shown in the drawing and explained in more detail with reference to embodiments.

FIG. 2a shows an inventive NBSEM in accordance with Patloc type 1;

FIG. 2b shows an inventive NBSEM in accordance with Patloc type 2;

FIG. 6b shows a contour plot of the field distribution of FIG. 6a;

DESCRIPTION OF THE PREFERRED EMBODIMENT

Figure 1A:
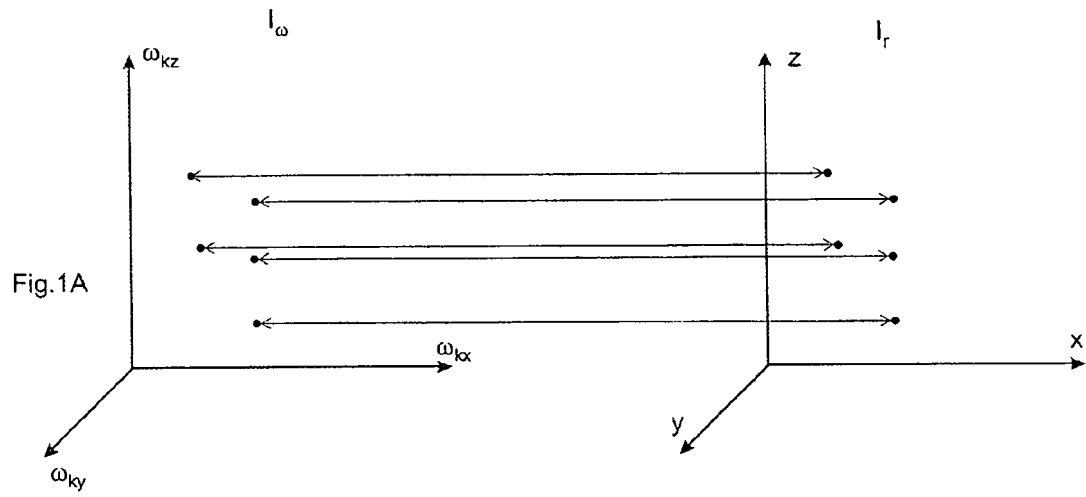
FIG. 1a shows a schematic illustration of the principle of local encoding of magnetic field gradients in accordance with prior art.

The invention concerns a method of MR (magnetic resonance) tomography using temporally varying magnetic field gradients for local encoding. In conventional MRT methods, local encoding is realized by magnetic field gradients, wherein gradient systems with preferably spatially constant magnetic field gradient corresponding to a preferably linear change of the magnetic field strength along the respective spatial direction are preferentially used. Orthogonal gradient systems with gradients in the x, y, and z directions are generally used in this connection. Local gradient systems are also known and may also be used for local encoding, however, deviations from a linear distribution occur due to construction, which can be compensated for through corresponding distortion correction. These local gradients have no linear relation between the local field strength (and thereby the Larmor frequency) and the location of the signals caused by the excited spins either, but still a monotonic and therefore unique relation. The signals are uniquely associated with one of the known methods through 1-, 2- or 3-dimensional local encoding, thereby varying the magnetic field gradients in all three spatial directions in correspondence with the conventional principles of e.g. Fourier encoding, filtered back projection or any other conventional method, optionally in connection with slice-selective pulses in one, two or three spatial direction s to limit the measuring volume. These methods have in common that after lapse of the imaging measuring sequence, the measured signals can be uniquely associated with the location.

The common basic principle of all imaging methods defined by spatially varying magnetic fields is that, for encoding an nd-dimensional image (nd=1,2,3), nd spatially varying magnetic fields are applied which generally have an at least approximately linear distribution (spatially constant gradient) and are disposed perpendicularly to each other. The dimensionality of local encoding of inherently three-dimensional objects can be reduced to two-dimensional methods (imaging), one-dimensional methods (line scan) and also direct voxel selection through application of slice selection methods, wherein the most frequently used method consists of a two-dimensional image (imaging).

Towards this end, spatially varying magnetic fields $B_z(x,y,z)$ are used for local encoding, which cause a local change of the main field $B_{z0}$ and cause that nuclei at different locations have different Larmor frequencies. These fields are ideally applied as fields which change linearly along the 3 spatial directions, usually called x, y, and z gradients $G_x$, $G_y$ and $G_z$. For constant gradients of a strength $g_x$, $g_y$ and $g_z$ in correspondence with a linear change of the magnetic field along the respective local coordinate, the following applies:

$$G_x = B_z(x,0,0) = xg_x, \ G_y = B_z(0,y,0) = yg_y, \text{ and } G_z = B_z(0,0,z) = zg_z. \quad (1)$$

This design of the spatially varying magnetic fields in the form of fields with a field strength which linearly varies along the location has shown that the fields used for local encoding (or also the devices used to generate these fields) are usually generally called "gradients". The term gradient implies a monotonic slope (as in conventional gradients) as well as a unidirectional orientation. The term SEM (spatial encoding magnetic field) is introduced below as generic term to designate also non-monotonic, non-unidirectional, spatially varying magnetic fields. In order to explain the use of language, the used terms are defined below:

Gradient: spatially varying magnetic field, generally used in the sense of a –> conventional gradient.

Conventional gradient: spatially varying magnetic field with approximately linear and unidirectional field distribution along the respective local direction –> MSEM.

Gradient system: Entirety of a device used for local encoding. A gradient system of prior art usually generates 3 conventional gradients in the x, y, and z direction, whereas in the inventive arrangement, at least one of the fields used for local encoding is designed as NBSEM. It must be noted that an NBSEM can also be formed through a combination of two spatially offset conventional gradient systems.

SEM (spatially encoding magnetic field): a locally varying and optionally time-variant magnetic field which is used for local encoding and may be designed either as conventional gradient (=MSEM corresponding to a monotonically varying field) or as an NBSEM (non-bijective spatially encoding field).

MSEM (monotonic spatially encoding magnetic field): monotonically varying magnetic field for local encoding –> conventional gradient.

NBSEM (non-bijective spatially encoding field): a spatially varying and optionally time-variant magnetic field which is used for local encoding and is designed such that allocation of the local field strength with the location along at least one position vector is not bijective. Bijectivity is obtained, in particular, through a non-monotonic distribution of a gradient field which is unidirectional in each partial area but not unidirectional in total (in the description Patloc type 1) or through a gradient field which is not unidirectional in at least one partial area, corresponding to a curved field distribution (Patloc type 2).

In mathematical terms, the principle of local encoding using spatially varying magnetic field gradients consists in allocating each signal intensity $I_r(x,y,z)$ in local space to one signal intensity $I_\omega(\omega_{kx}, \omega_{ky}, \omega_{kz})$ in frequency space by using magnetic field gradients. $I_\omega(\omega_{kx}, \omega_{ky}, \omega_{kz})$ thereby results through Fourier transformation of the acquired k space data $F(k_x,k_y,k_z)$. In general, the following applies for an N-dimensional mapping using N different magnetic field profiles $B_z(x,y,z)$:

$$I_\omega(\omega_{kx},\omega_{ky},\omega_{kz}) = FT\{\int\int\int M(x,y,z)\exp(-i\gamma\int B_z(x,y,z,t)dt) \, dxdydz\} \quad (2)$$

wherein $M(x,y,z)$ is the magnetization at location (x,y,z). Conventional imaging utilizes constant magnetic field gradients in the three spatial directions (see equation (1)).

For n-dimensional data acquisition, we obtain an image in the frequency space $I_\omega(\omega_{kx}, \omega_{ky}, \omega_{kz})$ which can be transformed directly into $I_r(x,y,z)$ through linear transformation. Also for non-constant (but monotonic) gradients, $I_\omega(\omega_{kx}, \omega_{ky}, \omega_{kz})$ can be transformed through non-linear (but unique) transformation to $I_r(x,y,z)$.

The Larmor relation $$f(x,y,z) = (\omega_{kx},\omega_{ky},\omega_{kz}) = \gamma G(x,y,z)$$

results in $$f^{-1}(\omega_{kx},\omega_{ky},\omega_{kz}) = (x,y,z) = 1/\gamma G^{-1}(x,y,z) \quad (3),$$

i.e. mapping from $(\omega_{kx}, \omega_{ky}, \omega_{kz})$ to (x,y,z) is obtained via the inverse function of the gradient distribution.

For local encoding with conventional gradients, we obtain a linear relation between $(\omega_{kx}, \omega_{ky}, \omega_{kz})$ and (x,y,z) in correspondence with $$(x,y,z) = (\omega_{kx},\omega_{ky},\omega_{kz})/(\gamma^* G(x,y,z)) \quad (4),$$

which can be separated for unidirectional gradients into $$(x) = (\omega_{kx})/(\gamma^* G(x)) \quad (4a)$$

$$(y) = (\omega_{ky})/(\gamma^* G(y)) \quad (4b)$$

$$(z) = (\omega_{kz})/(\gamma^* G(z)) \quad (4c)$$

or in vectorial notation:

$$\begin{pmatrix} x \\ y \\ z \end{pmatrix} = 1/\gamma \begin{pmatrix} \omega_{kx} & 0 & 0 \\ 0 & \omega_{ky} & 0 \\ 0 & 0 & \omega_{kz} \end{pmatrix} \begin{pmatrix} G(x) \\ G(y) \\ G(z) \end{pmatrix} \quad (5)$$

The collinearity of the basis functions (x,y,z) or $\omega_{kx}$, $\omega_{ky}$, $\omega_{kz}$ relative to the frequency coordinates and their inherent orthogonality of the space spanned by the respective vectors is the basis of the k space concept which reflects the one-to-one equivalence between the local space and the frequency space. The mapping is always unique when the gradient distribution is strictly monotonic and therefore bijective, because only in this case is each point in local space (x,y,z) uniquely associated with a point in frequency space ($\omega_{kx}$, $\omega_{ky}$, $\omega_{kz}$), i.e. the inverse function of the field distribution is unique (see FIG. 1A).

For non-linear fields, one obtains a non-linear image equation, in which the local coordinates are generally associated with a location via a tensor which is different at every location:

$$\begin{pmatrix} x \\ y \\ z \end{pmatrix} = 1/\gamma \begin{pmatrix} \omega_{kx} & \omega_{kxy} & \omega_{kxz} \\ \omega_{kyx} & \omega_{ky} & \omega_{kyz} \\ \omega_{kzx} & \omega_{kzy} & \omega_{kzz} \end{pmatrix} \begin{pmatrix} G(x) \\ G(y) \\ G(z) \end{pmatrix} \quad (6)$$

The vectors in the local space and frequency space are no longer collinear. Direct association between the vectors in the local space and frequency space no longer exists.

For two- and one-dimensional data acquisition, the equations (1)-(4) can, of course, be correspondingly transformed, wherein the observed volume can be correspondingly reduced to a layer or voxel through corresponding slice selection pulses or alternatively, acquisition is performed as project method, wherein the signals are projected on one image point each along the non-locally encoded direction.

2. Inventive Local Encoding

Figure 1B:
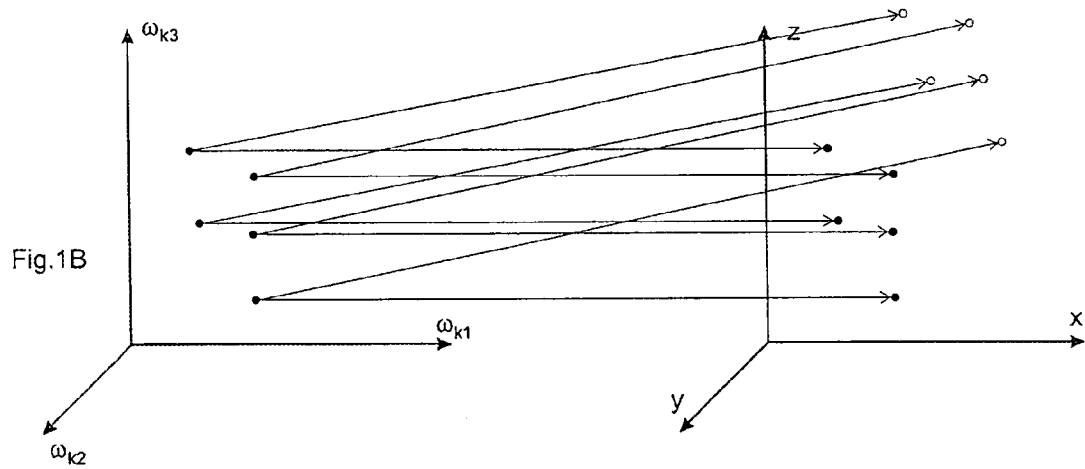
FIG. 1b shows a schematic illustration of a first step of the inventive method of local encoding.

In contrast thereto, the inventive method uses magnetic fields for local encoding, which vary in space and time and are characterized in that the local encoding in frequency space $I_\omega(\omega_{k1}, \omega_{k2}, \omega_{k3} \ldots)$ caused by these fields, is not bijective relative to the local space $I_r(x,y,z)$ of the measuring volume to be investigated of the object under investigation and is not collinear in accordance with equation (6), such that data acquisition using such fields produces an ambiguous mapping as is shown in FIG. 1b. In data acquisition in accordance with any measuring method based on the use of locally encoding SEMs for one-, two- or three-dimensional imaging, at least one of the MSEMs (=conventional gradient) used in conventional data acquisition along a spatial direction is therefore merely formally replaced by a spatially varying magnetic field which produces ambiguous local encoding.

In a sufficient configuration for this, at least one of the locally encoding magnetic fields which vary in space and time and used for local encoding, has a non-monotonic and curved distribution, i.e. the magnetic field generated by this local encoding field has local minima (and/or maxima) in the area to be imaged of the object to be imaged. The use of such a non-bijective NBSEM produces a double (or multiple) ambiguity of allocation of the local frequencies. When spatially variable magnetic fields are used, wherein at least one of the used spatially variable magnetic fields has local extreme values, the image in accordance with equation (1) permits no unique allocation from $I_\omega(\omega_{kx}, \omega_{ky}, \omega_{kz})$, to $I_r(x,y,z)$, but produces ambiguities in the mapping, i.e. at least one partial area of the image has paired locations, whose coordinates x1, y1, z1 and x2, y2, z2 correspond to identical coordinates in frequency space.

Figure 1C:
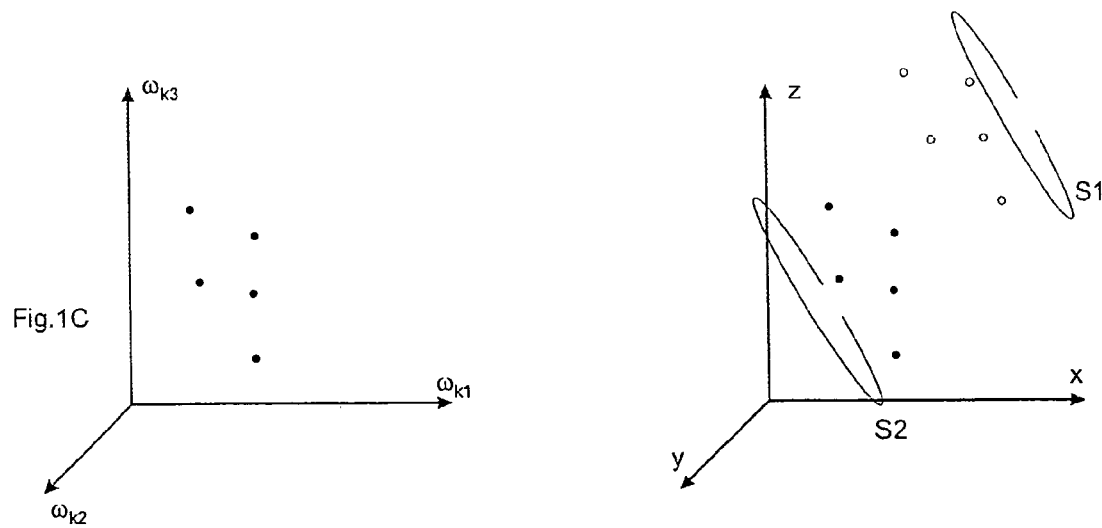
FIG. 1c shows a schematic illustration of a second step of the inventive method for local encoding.

Analog to the unidirectional, alternating fields (Oppelt), several (at least two) coils with a spatially varying and differing sensitivity profile are used for data acquisition in such non-bijective and curved local encoding magnetic fields, such that spatial encoding is unambiguous when taking into account the spatial sensitivities of the coils (FIG. 1c).

The inventive method is thereby based on the findings, that the ambiguities relating to local encoding through NBSEM can be divided through subdividing the entire measuring area along the hyper surfaces defined by local extreme values (minima or maxima) into ng partial areas or regions inside of which there is a unique (but not collinear) association between $I_\omega(\omega_{kx}, \omega_{ky}, \omega_{kz})$ and $I_r(x,y,z)$. When at least ng receiver coils are used for data acquisition, each having a spatially variable and differing sensitivity profile, wherein the number ng of the measuring coils must amount to at least the ambiguity of allocation, the measured signals can be uniquely associated. An inventive system designed in this fashion and using non-bijective, curved NBSEMs in combination with receiver coils with spatially selective sensitivity profile is called PatLoc system below (parallel imaging with local gradients).

This basic principle is illustrated below:

FIG. 2A illustrates an NBSEM with the illustrated (2-dimensional) field distribution, which is characterized in that the function of the field strength along one (in principle arbitrary) local direction r passes through an extreme value (maximum or minimum, in the present example a minimum). There are locations of identical fields on both sides of the curved connecting line, characterized by g0, of the extreme values, which is shown as example by the contour lines g1I and g2I. Such a magnetic field profile can be divided along g0 into two areas characterized by Gloc1 and Gloc2. The field distribution within each of these areas is monotonic and therefore suited for local encoding with a unique image.

A hyper surface is generally defined as a (n−1) dimensional entity of an n-dimensional function. For a one-dimensional mapping, the "hyper surface" used for separation into locally unambiguous areas is therefore a point (=the location of the local extreme value); for a two-dimensional mapping a line—as shown; for a three-dimensional image it is finally a separation along a surface which is correspondingly defined by the local extreme values and generally curved in space. This field profile obtained through corresponding hyper surfaces in uniquely associable partial areas is called below Patloc type 1.

FIG. 2b shows a further embodiment of the magnetic field which can be separated into areas with unique field allocation in accordance with the same principle, which achieves unique allocation of signals from the respective locally unique field areas through measurement with separate receiver coils. The field profile is designed such that the field between the receiving areas is curved to such a great extent that a field distribution with a local minimum is obtained, in turn, along at least one local direction r(z), wherein z characterizes any direction in space. The three-dimensional magnetic field need not necessarily have a minimum/maximum. A minimum/maximum occurs only along one (arbitrary) direction. An arrangement of this type is called Patloc type 2 below.

As a necessary and sufficient condition of the inventive method, it can be derived from these examples that the (generally three-dimensional) magnetic field profile used for local encoding is designed to have local extreme values along a curved position vector. It should thereby be noted that clearly also conventional linear fields inevitably have such extreme values in the respective decaying area at the edges due to their final extension. In conventional acquisition methods, data acquisition is performed such that these edge areas are excluded from acquisition, or the image artefacts produced through unintentional convolutions are eliminated by corresponding methods. Devices and methods, wherein such an ambiguous image is realized as integral part of local encoding, are not known in the art.

For reasons of simplicity, the discussion below is based on a one-dimensional distribution of an NBSEM in accordance with Patloc type 1. In the one-dimensional case, the main features of the imaging behaviour correspond, in principle, to the conditions evidenced for the unidirectional field distribution of Oppelt, however, with the side conditions that the position vectors are now curved in space along the profile of the NBSEM. The spatial resolution along these curved position vectors when using an NBSEM depends on the (local) steepness of the magnetic field gradient. In general, the size of the acquisition window $\Delta\omega$ in the frequency space $I_\omega$ for discrete data acquisition thereby acquiring a complex data point at a temporal separation $t_s$ is given in correspondence with the Nyquist theorem by $$\Delta\omega = 1/ts. \quad (7)$$

When mr data points are acquired during an acquisition time of $t_{ACQ}=mr\, t_s$, the resolution (pixel size) $\omega_{res}$ in the frequency space is $$\omega_{res} = \Delta\omega/mr \quad (8)$$

in correspondence with the sampling theorem.

In conventional imaging with unidirectional and constant magnetic field gradient with constant strength $g_0$, the size of the acquisition area FOV in local space results in accordance with the Larmor relation in $$FOV = \Delta\omega/(\gamma g_0). \quad (9)$$

$\Delta\omega$ is thereby the bandwidth used for data acquisition, and for acquisition of individual (complex) data points at a separation $t_s$, $\Delta\omega = 1/t_s$. The local resolution $r_{res}$ (measured as pixel size) is then given by $$r_{res} = FOV/mr = 1/(\gamma g_0 t_s mr) = 1/(\gamma g_0 t_{ACQ}) \quad (10)$$

wherein mr represents the number of acquired data points (=matrix size) and $t_{ACQ}=t_s\, mr$ corresponds to the acquisition time for acquiring the mr data points.

When a non-linear SEM is used, $\Delta\omega$ and $\omega_{res}$ are still given by the Nyquist theorem, but the spatial resolution $r_{res}(r)$ depends on the location. When the field distribution is at least almost linear across $\omega_{res}$, the local resolution $r_{res}(r)$ can be defined by the local steepness:

$$g(r) = d\omega/dr$$

of the NBSEM at the location r:

$$r_{res} = \omega_{res}/g(r) = \omega_{res}/(d\omega/dr) \quad (11)$$

As is shown in equation (9), the pixel size is oppositely proportional to the local steepness of the SEM.

In the area about the extreme value of an NBSEM, the resolution $r_{res0}$ is defined by the area within which the resonance frequency is between $\omega_{min}$ and $\omega_{min}+\omega_{res}$. Through displacing the frequency pattern by $\omega_{res}/2$ (or another fraction of $\omega_{res}$), $\omega_{res0}$ can be varied correspondingly. When $\Delta\omega$ is correspondingly selected, it must be noted and is advantageous in some cases that the area to be imaged may also be discontinuous, when the Larmor frequencies are in ranges around the extreme values outside of the frequency range covered by data acquisition.

In order to illustrate the elimination of ambiguity of the mapping in such an NBSEM through use of measuring coils with spatially varying sensitivity, FIG. 4A initially shows again such a one-dimensional field profile Bz(r) along the direction r of a curved position vector r(x,y,z), which, in turn, has an extreme value along r, such that there are paired positions ra and rb on both sides of the minimum, where Bz assumes identical values. For one-dimensional local encoding along such a field profile, the signals of the spins at ra and rb cannot be distinguished. This can be formally described as mentioned above in that Bz is divided into two areas, each of monotonic distribution, within the value ranges 0 . . . rmin or rmin . . . rm. (Unambiguous) local coordinate systems r1 and r2 are then defined within each of these two areas.

In the one-dimensional case, this description is analog to that of Oppelt, wherein the curved position vector r is then transferred into a uni-dimensional directional vector Z (in the glossary of Oppelt).

The ambiguous mapping equation (1) can be illustrated through corresponding generalization of the Oppelt's description of unidirectional, alternating gradients:

$$I_\omega(\omega_{kx},\omega_{ky},\omega_{kz}) = I_\omega(\omega_{loc1x},\omega_{loc1y},\omega_{loc1z}) + I_\omega(\omega_{loc2x},\omega_{loc2y},\omega_{loc2z}) \ldots I_\omega(\omega_{locNx},\omega_{locNy},\omega_{locNz}) \quad (5)$$

Then, the individual contributions of the measured signals can be distinguished in that data is acquired with at least 2 receiver coils S1 and S2, each having different sensitivity profiles s1 and s2 along r. In the simplest case (FIG. 4B), the sensitivity profiles do not overlap, such that each coil detects only one part of the field profile which is uniquely defined in the area of the respective field, i.e. this arrangement yields local unambiguity: The signal in r1 is only detected by S1, signals from r2 only by S2. But also with overlapping sensitivity profiles (FIG. 4C), the signal contributions from r1 and r2 can be separated with known sensitivity profiles: The signals I1(S1) and I2(S2) are a weighted average of the signals I(r1) and I(r2) with the weighting factors s1 and s2 determined by the sensitivity profiles:

$$I1(S1) = s1(r1)I(r1) + s1(r)I(r2) \text{ and}$$

$$I2(S2) = s2(r1)I(r1) + s2(r2)I(r2)$$

For known weighting factors, the signals I(r1) and I(r2) can be calculated from the measured signals from this equation system through solving the equation system.

The calculation formally corresponds to the algorithms of Oppelt, in full analogy with the conventional methods which are used in parallel imaging. In contrast to parallel imaging, these principles are here used to eliminate the ambiguity of allocation of the resonance frequencies, while conventional methods of parallel imaging are designed to deal with ambiguities through sub-scanning the discrete k space data used for the subsequent image reconstruction. There are a plurality of algorithms for data reconstruction in literature, which perform parallel reconstruction either on the basis of the directly acquired k space data (SMASH, GRAPPA . . . ) or using the image data (SENSE . . . ). An overview of the current techniques is given in (Top.in Magnetic Resonance 15, 129 (2004) and Top.in Magnetic Resonance 15, 223 (2004). One trivial case is the PILS technology, wherein—in correspondence with FIG. 4B—the sensitivity profiles of the individual coils do not overlap such that at any point of $I_\omega$ only one $S_m$ (with m=1 . . . nc corresponding to the number of receiver coils) is considerably larger than zero, such that the overall image can be obtained from the combination of individual images without further conversion.

In addition to use of parallel imaging techniques for reducing the amount of data to be acquired (and therefore the measuring time), parallel imaging (PI) techniques were also used to reduce artefacts e.g. due to through flux and motion (Magn.Reson.Med 52, 825 (2004)), to avoid convolution artefacts (Top.in Magnetic Resonance 15, 267(2004), J. Magn. Reson. 12, 795 (2004)), and to improve data acquisition along the time axis (so-called k-t-BLAST methods (Magn.Reson.Med. 50, 1031 (2003))). Finally

3. Inventive Apparatus

Figure 5:
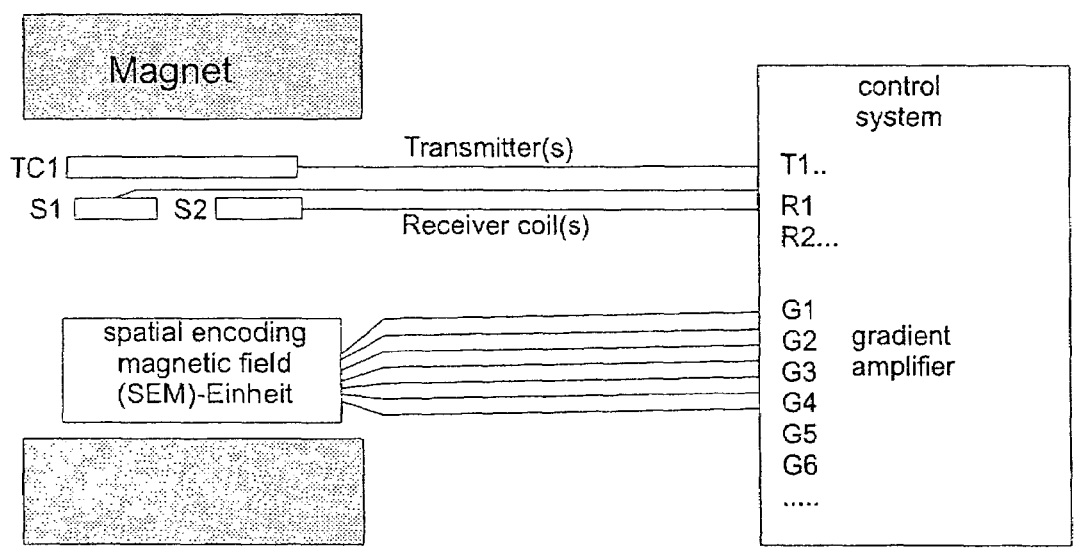
FIG. 5 shows a schematic structure of an inventive apparatus for performing the inventive method.

The inventive apparatus may be schematically shown as example (see FIG. 5). It consists of a magnetic resonance tomograph which consists of a "control unit" which controls the measuring procedure, provides the excitation coil TC1 with the radio frequency pulses used for excitation via the transmitting output T1 . . . and passes on the signals received from the receiver coils S1, S2 . . . to the receivers R1, R2 . . . , wherein the transmitter and receiver coils may also be identical in the single-coil operation. The SEM unit is used to generate the spatially varying and time-variant magnetic fields which are used for local encoding, the SEM unit being distinguished from a conventional gradient system in that at least one of the SEM generated thereby is designed as NBSEM. This SEM unit may, in general, contain several partial systems which are characterized by G1, G2, G3. . . .

It is thereby possible (and mostly also preferred) to integrate also conventional x, y, z gradients as locally encoding fields (SEM) in the SEM unit. SEMs can also be generated in a different fashion, such as e.g. through corresponding arrangement of magnetic materials. However, the fields are generally preferably generated by current-carrying conductor loops. The term conductor loop thereby generically defines a material of any geometry through which a current flows, and is not necessarily limited to metallic wires of a certain diameter.

The conductor loops for generating SEM fields of a desired profile are thereby constructed and configured in accordance with one of the methods known from literature (see. E.g. Magn. Reson. Med. 34, 604 (1995) and the works cited therein). It must be noted that a certain SEM is not necessarily generated by a rigidly wired conductor loop using the gradient amplifier. Configurations, wherein a certain SEM is generated by several independently controlled conductor loops are also feasible and possibly advantageous. In a conventional gradient system, a constant gradient is generated with simultaneous control of several conventional gradients, such that a combination of several gradients produces, in turn, a monotonic gradient in a direction given by the amplitude of the individual gradients, i.e. the shape of the MSEM is substantially maintained, only the strength and direction change. However, non-monotonic SEMs can be realized with different geometries with the same hardware configuration through variation of the current strength and polarity of the currents in the respective conductor loops, depending on the type and characteristic.

As an example, an NBSEM corresponding to FIG. 2a can be generated by means of two conductor loops G1 and G2. The position of the hyper surface g0 separating the local field areas can be moved through independent variation of the currents flowing through G1 and G2 (see claim 6).

Conversely, it is also feasible and possibly advantageous to feed several SEMs through one common current supply, which produces optimum coherence of the field behavior of the fields generated by these SEMs. One example thereof is the arrangement, which is discussed below and shown in FIG. 7, of (at least) two spatially separated gradient partial systems GA and GB which can be operated easily by one common current supply of the respective gradients (see claim 7).

Individual or all partial systems of the SEMs can moreover be designed in known fashion as shielded gradient systems or, for force compensation, be designed correspondingly Lorentz force-compensated. In particular, when a global gradient system is part of the SEM unit, it is not required for all subsystems to contain all three components for spatial encoding. The adequate condition required compared to prior art consists in that, using at least one NBSEM, an ng-fold (with $ng \geq 2$) ambiguous magnetic field distribution is generated, and at least ng receiver coils with spatially different sensitivity profiles are used for unambiguous local encoding during data acquisition.

A series of implementations of the method can be derived from this general principle, which are preferred and useful for practical application, wherein the examples shown below are not to be understood as exhaustive enumeration but as being examples. The person skilled in the art can directly derive further implementations from the basic principles shown.

One essential and preferred purpose of application of PatLoc is to realize local encoding fields with reduced dB/dt with identical switching parameters. Upon generation of a field change of the same slope with a bimodal gradient Gpatloc, the extreme value $Bmax_{patloc}$ is smaller by approximately a factor of 2 with identical slope (=identical gradient amplitude), i.e. the stimulation threshold is reached with a PatLoc gradient in the ideal case only after ng-fold increase of the gradient strength or ng-fold increase of the switching speed $1/\Delta t$. In the real case of non-linear gradients, and taking into consideration the fact that x0 is outside of the linear imaging area for real systems, one obtains a correspondingly less distinct but still significant possible increase in the switching speed. In a preferred realization of such a Patloc system, a bimodal field with 2 maxima of the type shown in FIG. 6 is generated. It must be noted here that such a bimodal NBSEM, being arranged symmetrically relative to the resulting force of the Lorentz forces of zeroth order generated through interaction with the main field, is force-compensated for, and is thereby also advantageous in view of gradient noise or mechanical load compared to conventional gradients. In the central area (x=0), where Gpatloc has a horizontal distribution, the local resolution is, however, limited due to the flatter field distribution in accordance with equation (9). Through suitable selection of $\Delta \omega$, this area can be completely excluded from the imaging.

A further preferred example of application concerns the use of flat gradient partial systems, which are rigidly connected to one (or more) acquisition coils. Such systems are disclosed and described in literature (Concepts Magn. Reson Part B: 17-29, 2004).

Figure 7:
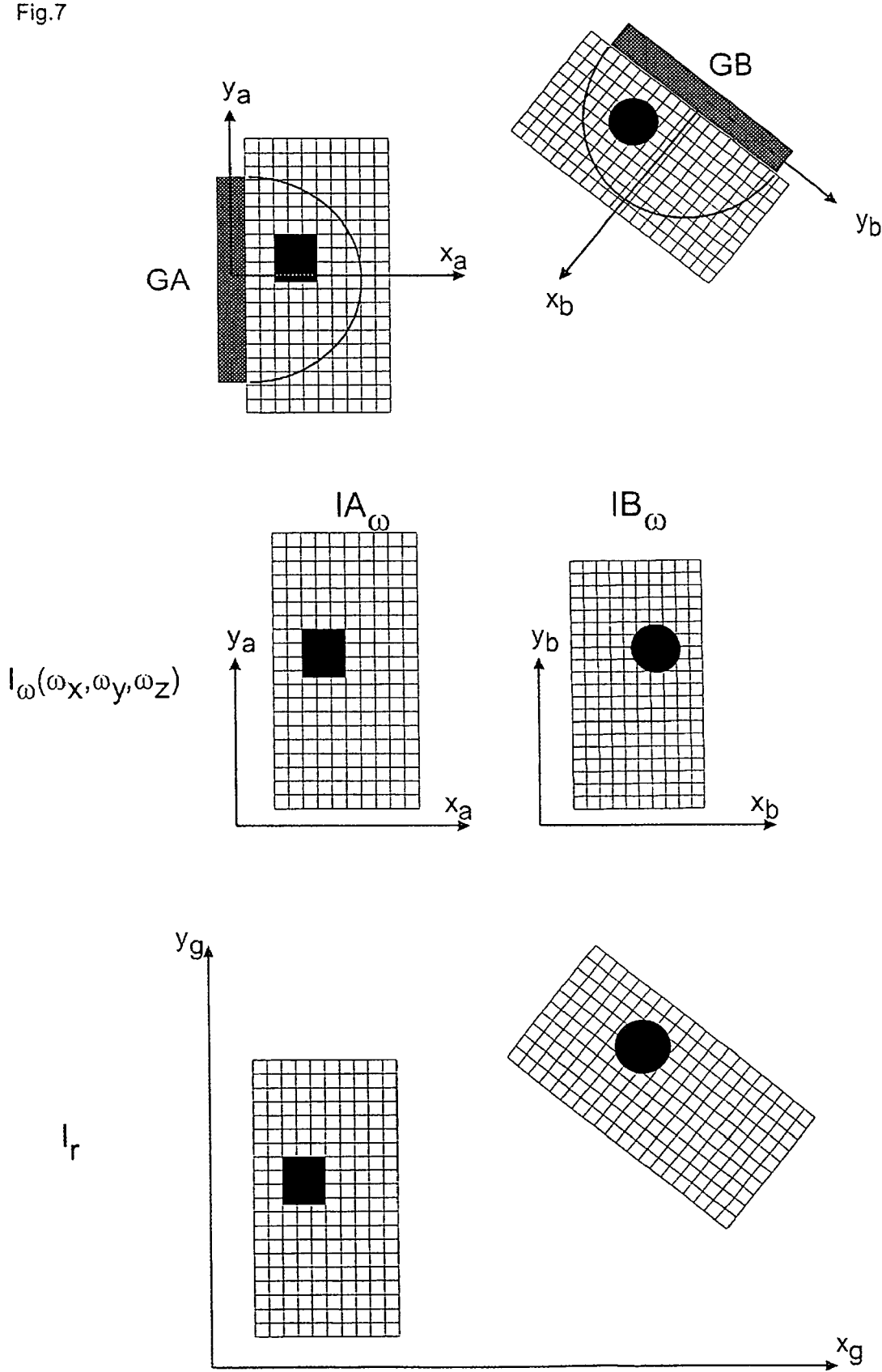
FIG. 7 shows the principle of combining two partial images (top, center) of two gradient partial systems GA and GB into one overall image (bottom)

This is shown in FIG. 7 by two partial systems GA and GB, wherein each of the systems generates local gradients in the respective coordinate system, which are used for imaging. If the fields caused by these gradients, as shown in FIG. 7, are (approximately) linear within the sensitivity range of the respective coils, and if the sensitivity profiles of the two coils have a sufficiently large mutual separation, an arrangement of this type can simultaneously acquire images from the respective sensitivity ranges. The geometrical image of each picture is thereby determined in each case through strength and orientation of the respective local magnetic field gradients. Formally, at least in principle, one independent experiment can be performed in each local field range. When a common excitation coil is used, which comprises the entire measuring volume and thereby all field areas, measurements with the same temporal course of the measuring sequence are preferably performed in all field areas, wherein the magnetic field gradients, however, can be adjusted to the local requirements in view of field-of-view, gradient direction etc.

With such an arrangement of ng local gradients, ng images are produced which can be allocated to the true location when the position of the respective arrangement in space is known.

Figure 8:
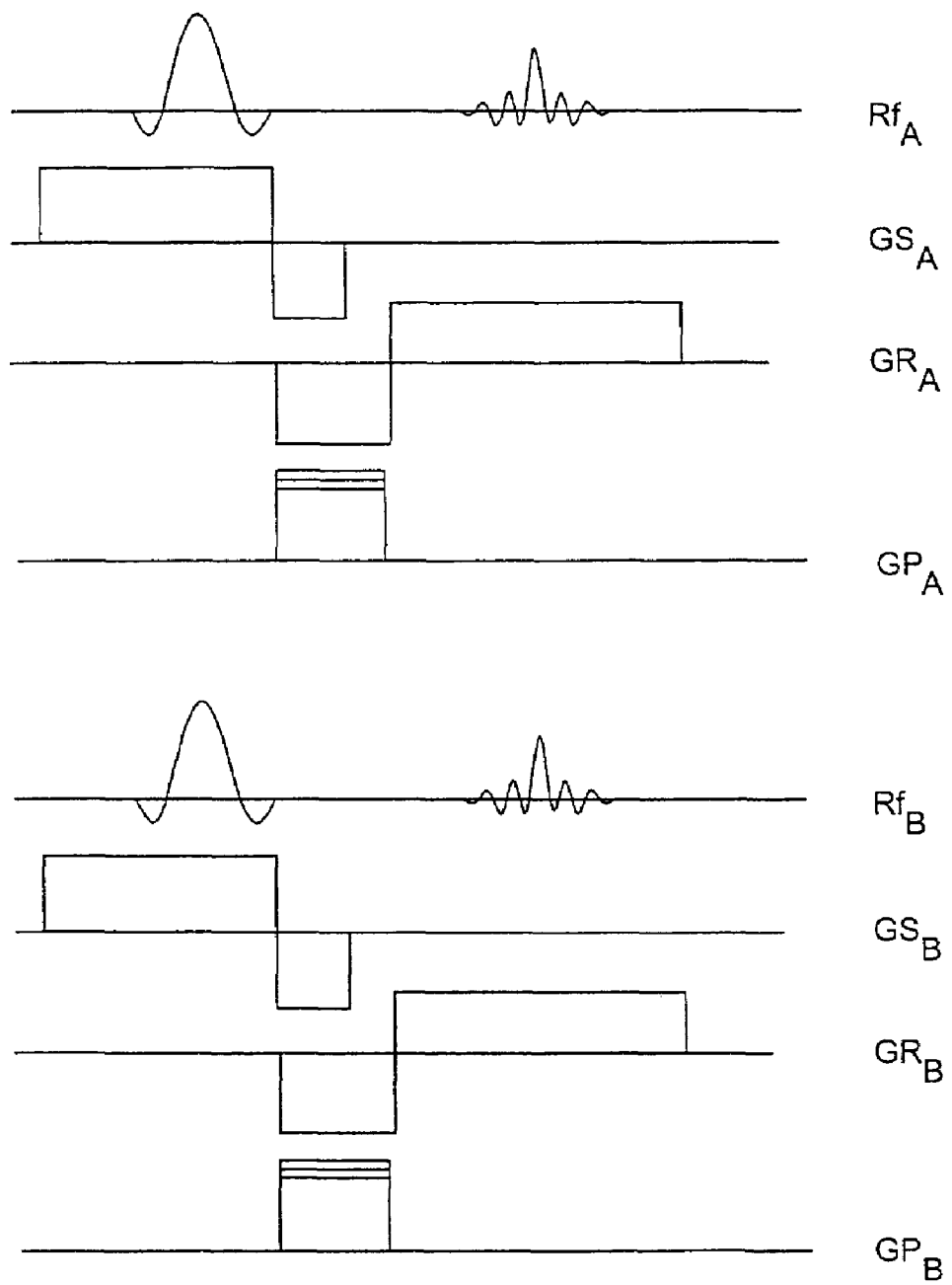
FIG. 8 shows an example of a measuring sequence for the inventive method, with the time axis extending to the right.

One possible measuring method using such a PatLoc system is schematically shown in FIG. 8. The two systems simultaneously perform one gradient echo experiment each, with slice selection gradients $GS_A$ and $GS_B$, read gradients $GR_A$ and $GR_B$ and phase encoding gradients $GP_A$ and $GP_B$. The radio frequency pulses $Rf_A$ and $Rf_B$ can be applied in correspondence with conventional methods of the state of the art either through application with a global excitation coil covering the entire measuring volume in a so-called cross-coil technology, wherein the radio frequency coils contained in A and B act as pure receiver coils, or in the respective transmit-receive technology, wherein each of the coils is designed as both transmitting and receiving coil, and wherein also the flip angles (and optionally also other relevant parameters) of the RF pulses can be varied independently.

It must be noted that the parameters associated with the individual systems GA and GB can be varied completely independently of each other. In particular, the respective gradients are independent of each other in terms of amplitude and direction. On the other hand, it may be advantageous to operate certain sequential parameters (such as e.g. the slice selection gradient) with a common global gradient system, which is existent in current tomographs anyway.

When a common global slice selection gradient $GS_g$ is used in the area of the coils A and B, coplanar layers in A and B are respectively excited. Moreover, when the gradients in the individual systems A and B have identical geometries, and gradients of the same amplitude are used in the two coils, the individual images $IA_\omega$ and $IB_\omega$ generated in the two coils can be mapped in a common coordinate system through translation and rotation. When the respective gradient partial systems have the same geometry but different amplitudes, the respective size of the measuring field must be additionally adjusted. Different geometries and, in particular, non-linearities of the used gradient systems also require distortion correction by means of the conventional gradient field distributions.

Figure 9:
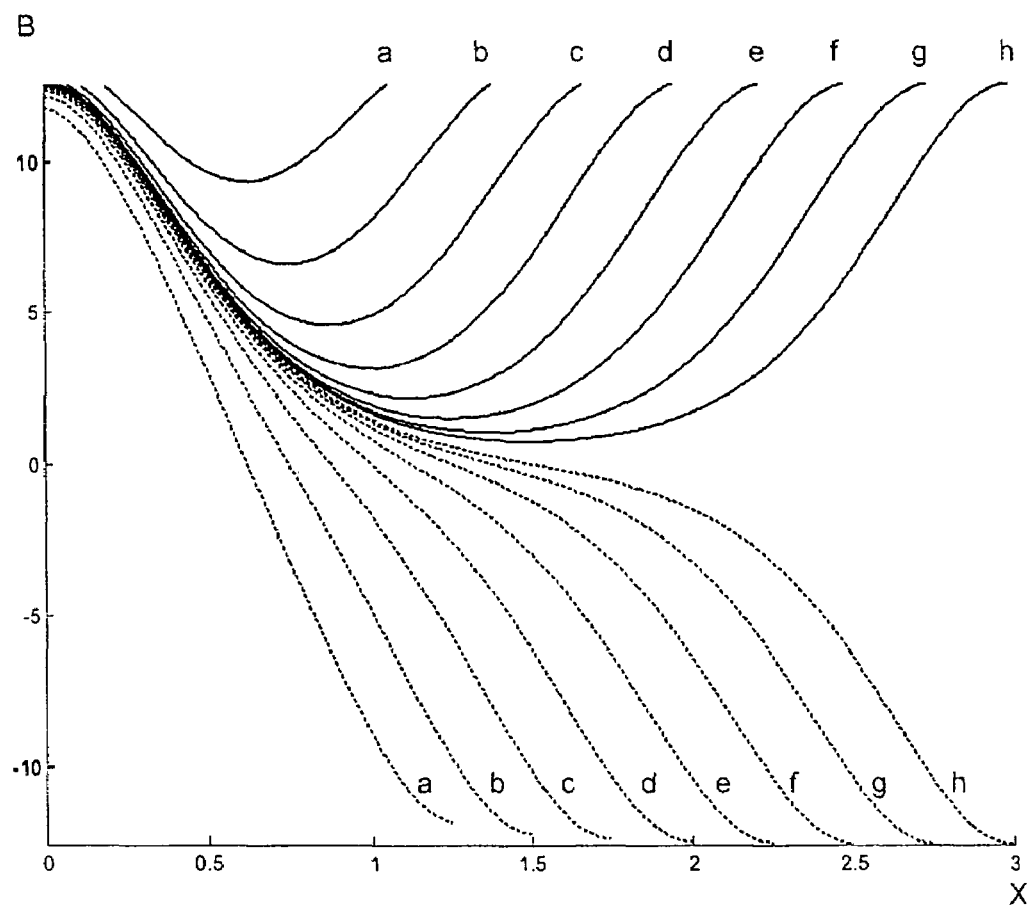
FIG. 9 shows a view of the magnetic field B between two circular conductor loops for different separations between the conductor loops.

The rectilinear image of FIG. 7 is idealized. Because of non-linearity of the gradients, distortions occur, which can, however, be corrected. When GA and GB approach each other, interaction between the gradient systems must be expected. The field profiles can thereby be calculated from the Biot-Savart Law. FIG. 9 shows the field distribution between two parallel circular coils as a function of the separation, in units of the coil radius, for fields with identical and opposite poles. The field strength was thereby calculated along the connecting line of the coil center points. The simulations show that, when the individual coils approach each other by more than one to two radii, significant interactions occur which must be considered in image reconstruction.

Figure 10A:
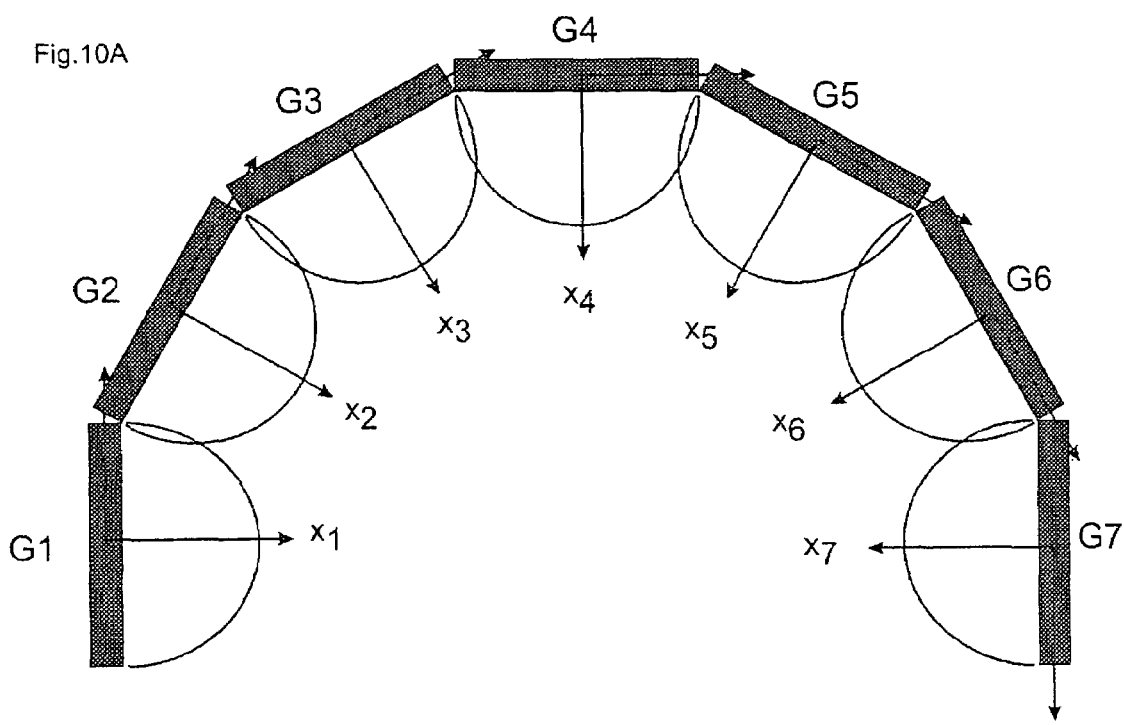
FIG. 10a shows an inventive convex arrangement of gradient coils G1 through G7.

FIGS. 10A and B schematically show another preferred realization of a PatLoc system. It can be derived from the arrangement of FIG. 7 in that individual partial systems are joined in such a manner that the directions x1 . . . xn of the respective individual gradients extend orthogonally with respect to the surface of the individual systems. In correspondence with the shown circular arrangement, one obtains a radial gradient distribution. Such systems can, however, also be realized in other geometrical arrangements and are particularly suited for local encoding perpendicular to the surface of the examined item. In particular, when the geometry of the arrangement is strictly predetermined, realization of such a magnetic field profile does not necessarily require one gradient coil per receiver coil, but an SEM for generating a corresponding field distribution can also be realized irrespective of the receiver coil configuration, wherein the number of receiver coils still determines the number of field areas that can be separated. Such a configuration permits easy integration of a gradient which is orthogonal to Gnx, and which can be used either as slice selection gradient perpendicularly to the image plane or as a local encoding gradient. An SEM of this type for such 2-dimensional local encoding is reasonable and useful mainly in combination with a very large number of individual coils, such that in the extreme case, local encoding defined through locally dependent magnetic fields is given only in two directions, while the voxel size in the third spatial direction is determined by the receiving area of the individual coils (so-called one voxel one coil (OVOC) method).

As is shown in FIG. 11, corresponding additional magnetic fields also produce local tangential gradients for complete local encoding. Arrangements with identical poles of the individual fields (++++++++) thereby produce a radial field gradient. The alternating polarity of the current flow in the 8 gradient coils (+−+−+−+−) generates 8 tangential locally monotonic fields. Respective other schemes of the current flow in the individual coils (++−−++−−++) produce local tangential fields in a pseudo Bessel arrangement.

An image is thereby possible only to a limited degree at the locations of local field reversal (i.e. at the field maxima and minima shown by + and −). A continuous image can be obtained by taking a complementary image through rotation of the NBSEM by 22.5° or through use of a second NBSEM rotated through 22.5°. In the 4-pole field arrangement generated by a (++−−++−−++−−) scheme, the complementary field arrangement rotated through 45° can be produced through changing the polarity scheme into (+−−++−−++−−+). Such NBSEMs called pseudo Bessel arrangements are, of course, not limited to an 8-fold symmetry, but can be easily generalized. Increasing the number of individual fields improves the linearity of the tangential fields in the respective local field areas, however, at the expense of the penetration depth.

The principle of use of nested, complementary NBSEM systems can be generalized also with respect to non-circular and non-periodical NBSEM arrangements (see FIG. 11) such that NBSEM systems are combined so that one NBSEM has a steep (and possibly linear) field distribution at the minimum point of the field gradient (=extreme value of the field) of the other NBSEM, such that when the data is acquired in nested form, each location of the covered measuring volume is locally encoded by at least one of the two NBSEM systems with a magnetic field gradient which is sufficient for the respectively desired local resolution, such that the overall data acquired using both systems produces a continuous image with high local resolution even in the area of the respective hyper surfaces. Also the bipolar NBSEM shown in FIG. 6 with the corresponding Gsuppl corresponds to this principle of complementarity in correspondence with a (++−−) or (−++−) arrangement.

4. Overview of the Figures

FIG. 1a shows the principle of local encoding by magnetic field gradients: Data is acquired in the frequency space $I_\omega$ with the local frequencies $\omega_{kx}$, $\omega_{ky}$, $\omega_{kz}$ encoded by the field gradients Gx, Gy, and Gz. The local frequencies are linked with the coordinates x, y, and z in the local space $I_r$ in an unambiguous (bijective) fashion.

FIG. 1b shows the principle of the inventive method, first step: spatial encoding is effected with non-linear, spatially varying magnetic fields which are designed such that association between frequency space and local space is not unambiguous but at least one partial amount of the locally encoded signals is subjected to an at least 2-fold ambiguous mapping in local space.

FIG. 1c shows the principle of the inventive method, second step: The data of these, at least partially ambiguously encoded signals is acquired with at least two coils S1 and S2 such that the signals, pairs of which have been identically encoded, can be separated via the local sensitivities of the two coils FIG. 2a shows a schematic view of one implementation of the inventive method (Patloc type 1). It uses a magnetic field profile which is designed to have respective paired contours g1(c) and g2(c) on both sides of the hyper surface extending through g0, such that the entire magnetic field profile is divided by the hyper surface g0 into two areas Gloc1 and Gloc2, each having monotonic field distributions. The arrows show in each case the direction of the local field gradient to illustrate in more detail that g0 represents the local field minimum (or maximum). The field distribution Bz has an extreme value along the coordinate r(z). The field profile is divided by g0 into two locally monotonic areas. The data is acquired with 2 coils S1 and S2, having different sensitivity profiles permitting separation of the respectively paired 2-fold ambiguous signals from the two field areas.

FIG. 2b shows a schematic view of one implementation of the inventive method (Patloc type 2). It uses a magnetic field profile which is designed such that the field distribution is curved, so that it has an extreme value along a local coordinate r(z). The field profile is divided by g0 into two local monotonic areas Gloc1 and Gloc2.

Figure 3:
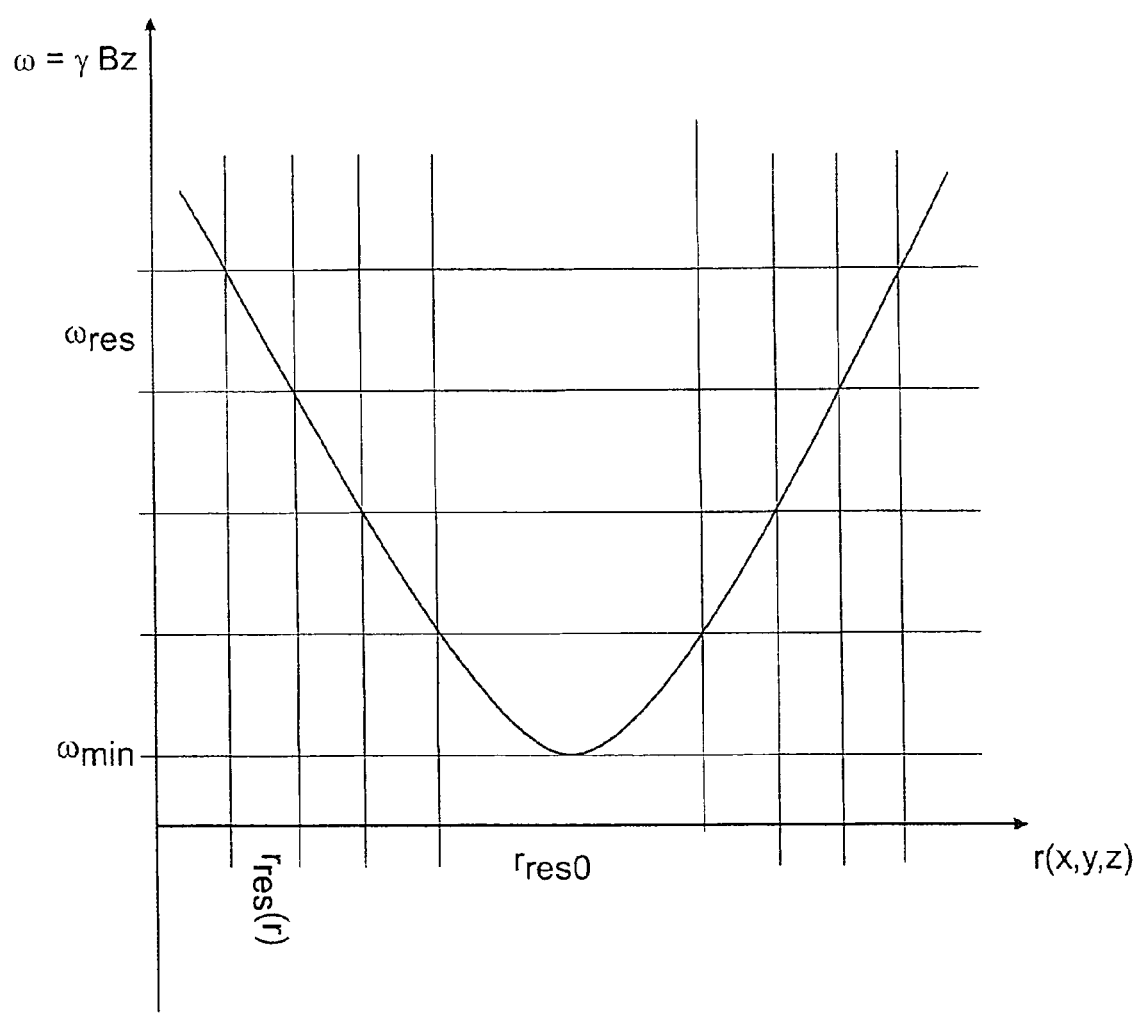
FIG. 3 shows a schematic illustration of the imaging properties of a non-monotonic magnetic field.

FIG. 3 illustrates the imaging properties in a non-monotonic magnetic field: the resolution (pixel size) $\omega_{res}$ in frequency space is constant in accordance with the sampling theorem. The non-linearity of the field distribution produces a resolution $r_{res}(r)$ which varies along the curved position vector r(x,y,z). The resolution $r_{res0}$ is limited in the area about the field minimum by the area in which the resonance frequency is between $\omega_{min}$ and $\omega_{min}+\omega_{res}$.

Figure 4:
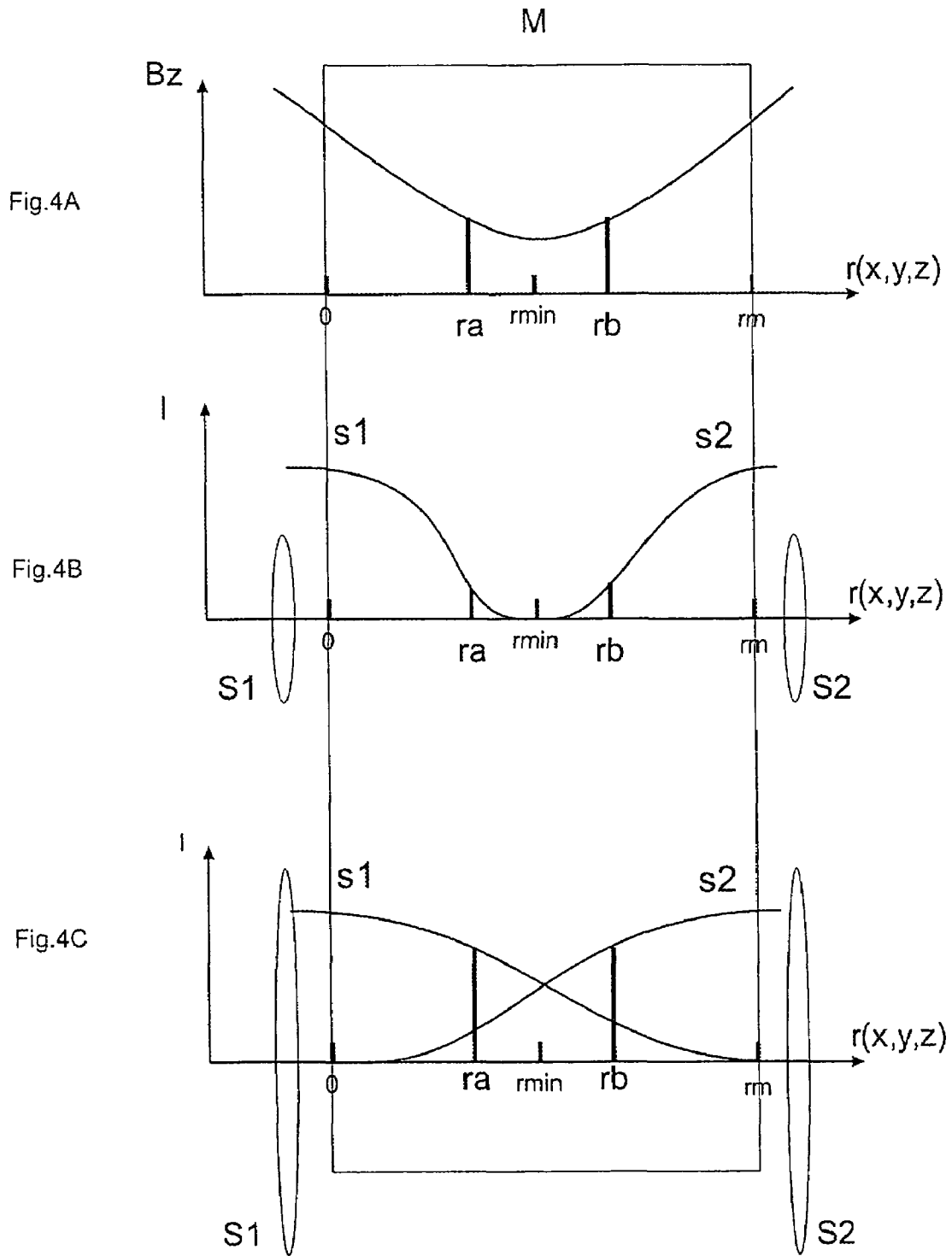
FIG. 4a shows an inventive NMSEM with a local minimum.
FIG. 4b shows first inventive sensitivity profiles of two receiver coils in the area of the NBSEM of FIG. 4A.
FIG. 4c shows second inventive sensitivity profiles of two receiver coils in the area of the NBSEM of FIG. 4A.

FIG. 4 shows the basic principle of use of receiver coils S1 and S2 with a spatially variable sensitivity profile s1 and s2 in each case for unambiguous allocation of the distribution of the magnetic field B in the imaging area M, which is ambiguous (parabolic in the present case). FIG. 4a shows the distribution of the magnetic field B along a local coordinate r. ra and rb characterize two locations of identical fields, xmin is the field minimum. M characterizes the measuring range from r=0 to r=rm. FIG. 4b represents the relative signal intensity I corresponding to the spatially varying sensitivity s1 and s2 of the two receiver coils S1 and S2 and shows that upon separation of the sensitivity areas of S1 and S2, the signals of spins which are identical with respect to local encoding, can be uniquely associated at ra and rb without further calculation. FIG. 4c shows that, when the sensitivity areas of the two coils overlap, the signals at locations ra and rb are detected by both coils with the respective sensitivities s1(ra) and s2(ra), and s1(rb) and s2(rb).

FIG. 5 shows a schematic structure of a measuring apparatus of the inventive method. The apparatus has at least one transmitter coil TC1 which is connected to at least one transmitter characterized by T1 ... and at least two receiver coils S1 and S2 which are each connected to the receivers R1 and R2. TC1 may thereby be identical to S1 and/or S2 during operation as transmitter-receiver coil. Local encoding is effected via spatially varying magnetic field units (partial systems) G1, G2 ... such that the magnetic field profile of at least one field profile generated by the respective units (or a combination thereof) is non-monotonic, i.e. has a hyper surface with points from local field extremes, such that the field profile is divided by this hyper surfaces into ng partial areas with monotonic field distribution each, wherein ng is smaller than or equal to the number of receiver coils used.

Figure 6A:
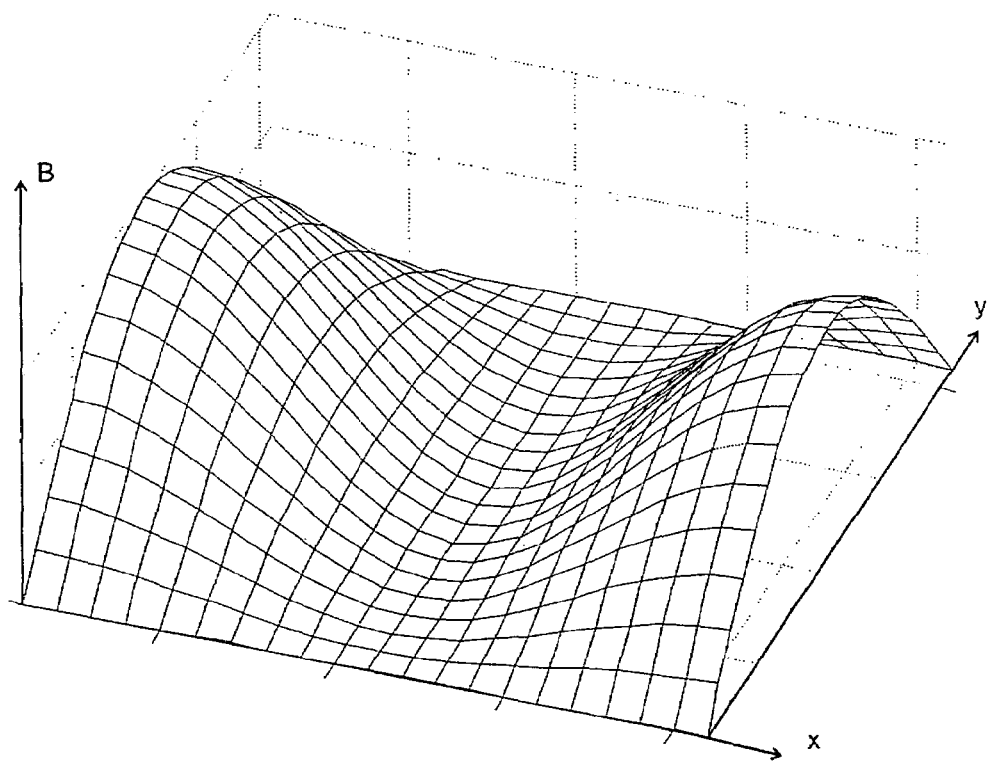
FIG. 6a shows a field distribution of an inventive NBSEM.
Figure 6B:
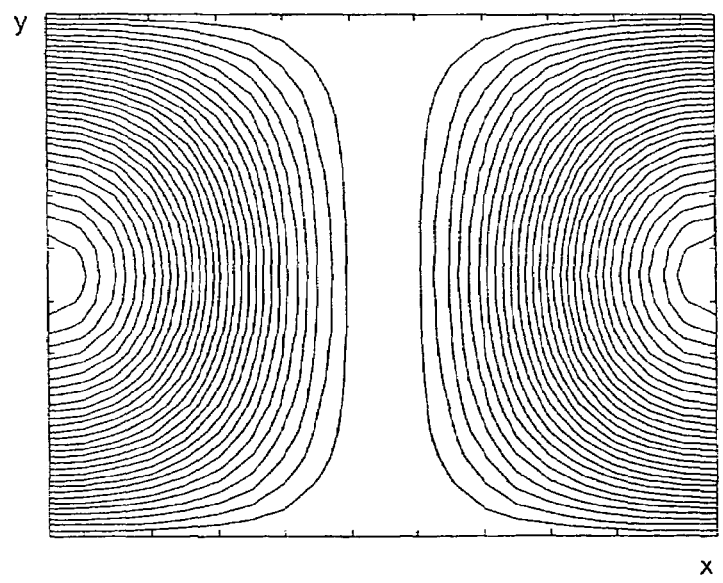

FIG. 6a shows the magnetic field B as a function of the local coordinates x, y in a preferred realization of a bipolar NBSEM with two field maxima. FIG. 6b shows the associated contour plot with the contour lines (=lines of the same resonance frequency) of the generated field in the x,y plane.

FIG. 7 shows the principle of one possible and preferred implementation of the Patloc principle through at least two (exactly two in the shown case) independent local gradient partial systems GA and GB which each produce an image $IA\omega$ and $IB\omega$ in their local coordinate systems xa, ya and xb, yb, respectively. When the arrangement and geometry of the respective fields are known, the individual images can be reconstructed true to location in the global imaging area $I_r$.

FIG. 8 shows an example of a measuring sequence for use with Patloc. Measuring sequences (in the present case gradient echo sequences with local encoding corresponding to a 2-dimensional Fourier transformation) are simultaneously performed in the two gradient partial systems shown in FIG. 7 using the respective local slice selection, read and phase encoding gradients $GS_A$, $GR_A$, $GP_A$ and $GS_B$, $GR_B$, $GP_B$, wherein the direction of the respective gradients is defined relative to the respective gradient partial system.

FIG. 9 shows the magnetic field B between two circular conductor loops with a radius r=1 (in arbitrary units), which are disposed parallel with respect to each other, as a function of the separation x for counter-poled (fully drawn lines) and homopolar (dashed lines) arrangements of the respective magnetic fields of the individual coils. In case of approximation about x<2, the fields generated by the two coils start to significantly influence each other.

Figure 10B:
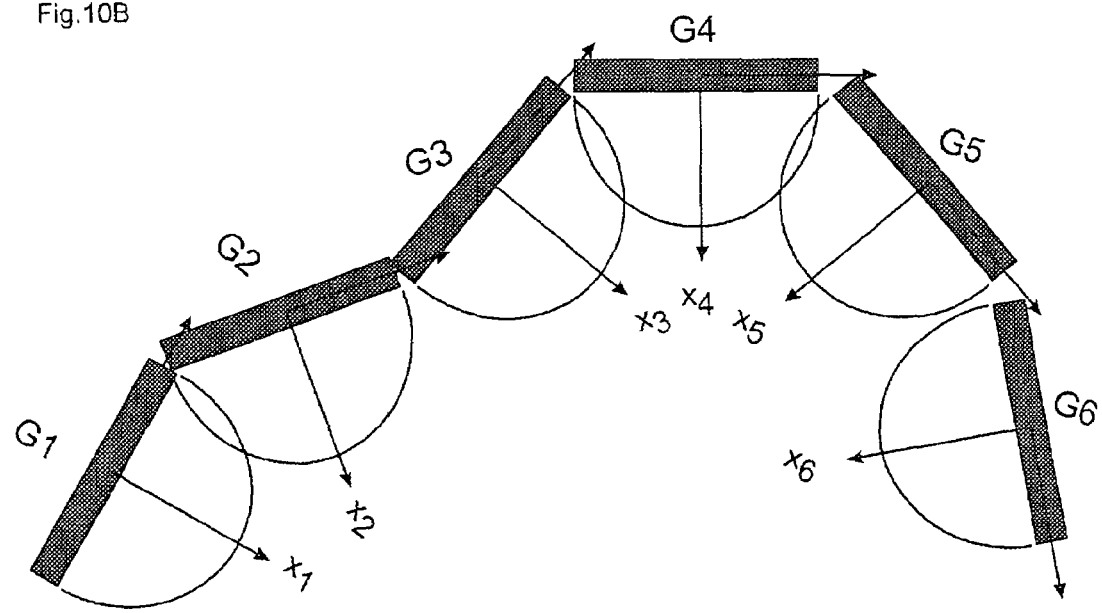
FIG. 10b shows an inventive arrangement of gradient coils G1 through G6 in another arrangement.

FIG. 10 shows an arrangement consisting of gradient coils (or gradient partial systems) GS1 through GS7, which generate a magnetic field gradient in the direction x1 ... x7 perpendicular to the respective coil. By means of disposing such coils next to each other along the surface of the object to be investigated, a local encoding perpendicular to the object surface is generated. FIG. 10A thereby shows a convex arrangement, FIG. 10B shows an arrangement along an arbitrarily curved surface.

Figure 11A:
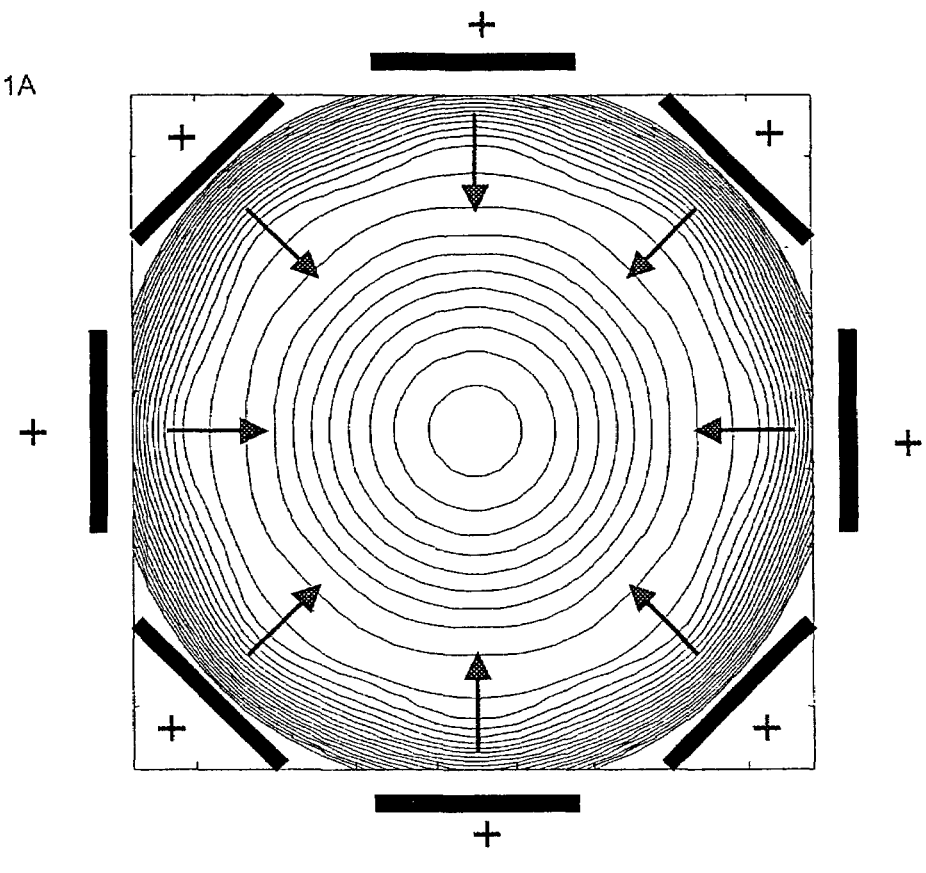
FIG. 11a shows an inventive, octahedral arrangement of eight gradient coils generating a first NBSEM.
Figure 11B:
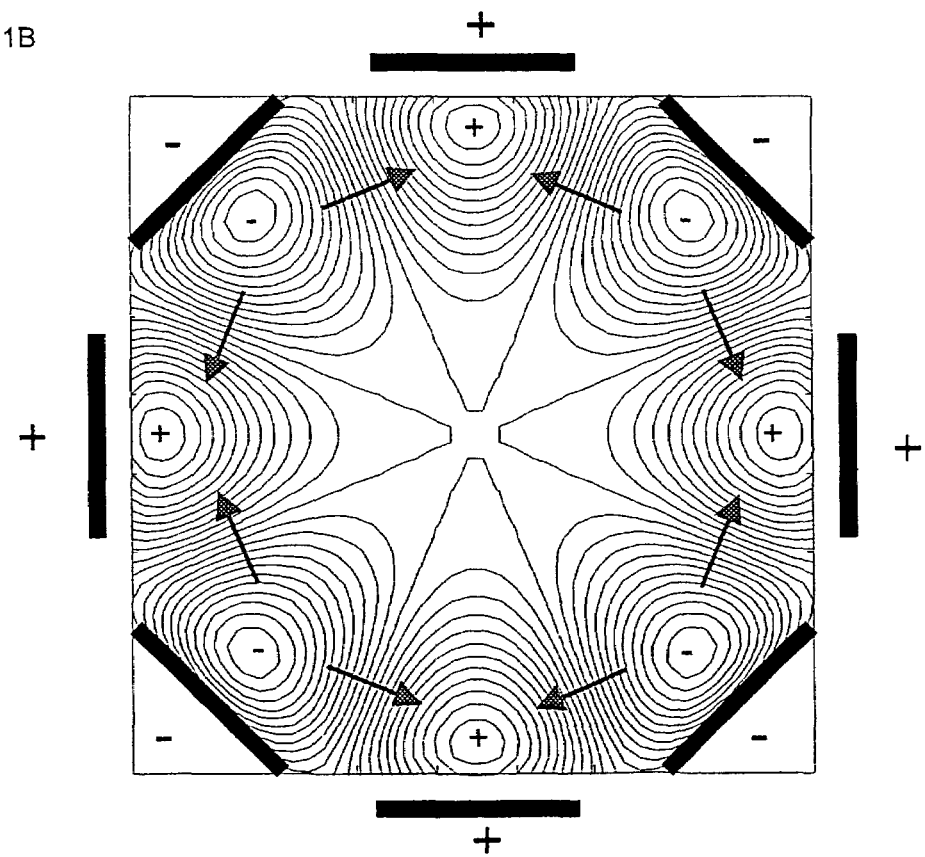
FIG. 11b shows the arrangement of FIG. 11a generating a second NBSEM which is complementary to the first NBSEM.

FIG. 11 shows an octahedral arrangement of 8 gradient coils (or gradient partial systems) (characterized as black bars). When the fields of the individual coils are oriented in the same direction (characterized by '+'—signs on the individual coils), one obtains an approximately radial magnetic field gradient orthogonal relative to the respective individual coils (FIG. 11A). For alternating polarity ('+' or '−') eight local areas with approximately tangential field gradient are generated in the edge area (FIG. 11B).

Figure 12:
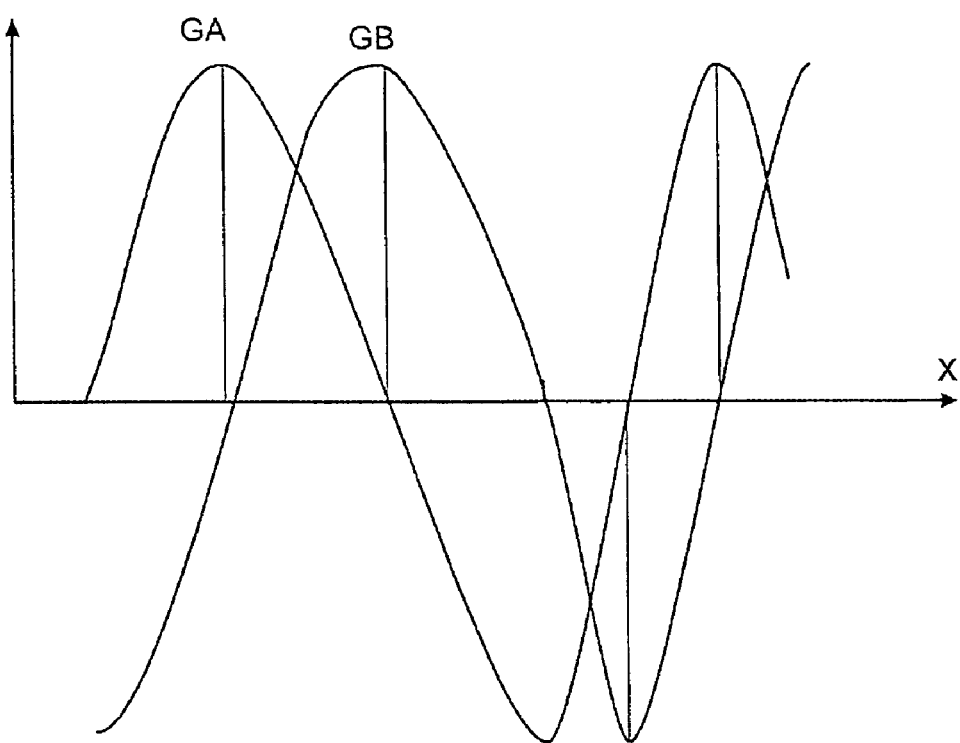
FIG. 12 shows the basic diagram of an inventive, complementary arrangement of NBSEMs.

FIG. 12 shows the basic principle of the complementary arrangement of NBSEM fields: The two fields GA and GB are arranged relative to each other such that each field has a steep (and preferably approximately linear) distribution at the location of the hyper surfaces (marked by vertical lines), characterized by local extreme values, of the respective other field, such that each location along x is in the steep and approximately linear area of at least one of the two NBSEM fields, thereby producing a continuous image along x by means of complementarily supplementing the data acquired with GA and GB.

5. REFERENCES

'Magnetic Resonance Imaging', Ed.MT Vlaardingerbroek, Springer-Verlag, 1999, ISBN 3-540-64877-1
Top.in Magnetic Resonance 15, 129 (2004)
Top.in Magnetic Resonance 15, 223 (2004)
Top.in Magnetic Resonance 15, 267 (2004)
Magn.Reson.Med 52, 825 (2004)
J.Magn.Reson. 12, 795 (2004)
Magn.Reson.Med. 50, 1031 (2003)
Magn.Reson.Med. 34, 604 (1995)
Concepts Magn.Reson Part B: 17-29, 2004
Oppelt, A. DE 198 43 463 A1
Dennis L. Parker, J. Rock Hadley, Gradient Arrays for High Performance Multiple Region MRI, Proc. $14^{th}$ Meeting ISMRM, Seattle, p. 521 (2006)

I claim:

1. Magnetic resonance tomography apparatus, comprising a gradient system that can generate at least one spatially varying and optionally time-varying magnetic field for at least one-dimensional local encoding of measuring signals in an area of a test sample to be imaged, characterized in that the gradient system contains at least one subsystem which can generate a non-bijective spatially varying magnetic field defined as NBSEM or ambivalent/non-bijective spacially encoding magnetic field for local encoding, wherein the function of the field strength of such an NBSEM within the area to be imaged has at least one local extreme value, a maximum or a minimum, wherein the area to be imaged is divided along the hyper surface formed by the entirety of all local extreme values of the at least one NBSEM into ng partial areas, with ng≧2, that the magnetic field profile has a non-unidirectional distribution within and/or over these partial areas, and that least ng receiver coils are provided which have a differing sensitivity in these partial areas.

2. Magnetic resonance tomography apparatus according to claim 1, characterized in that the gradient field associated with the NBSEM has a substantially unidirectional distribution within each partial area, whose direction, however, varies in different partial areas such that the total gradient field generated by this NBSEM has a curved distribution.

3. Magnetic resonance tomography apparatus according to claim 1, characterized in that the gradient field associated with the NBSEM has a non-unidirectional curved distribution also within at least one partial area.

4. Magnetic resonance tomography apparatus according to claim 1, characterized in that at least one further subsystem is provided for further local encoding within the area to be imaged, which can generate a further NBSEM, in particular wherein the local field gradient of the further NBSEM is approximately perpendicular to the local field gradient of the first NBSEM at every location of the area to be imaged.

5. Magnetic resonance tomography apparatus according to claim 1, characterized in that the gradient system contains at least one further subsystem which can generate a conventional gradient corresponding to a monotonically spatially varying magnetic field defined as MSEM monotonic spacially encoding magnetic field for further local encoding in one local direction in the area to be imaged, wherein the MSEM has a monotonic field strength distribution in its associated local direction in the area to be imaged.

6. Magnetic resonance tomography apparatus according to claim 1, characterized in that the subsystem for generating the at least one NBSEM has stationary conductor loops which can be separately controlled, such that not only the amplitude but also the shape of the NBSEM can be varied through varying the current strength and current direction in the conductor loops.

7. Magnetic resonance tomography apparatus according to claim 1, characterized in that the subsystem for generating the at least one NBSEM has at least ng spatially separate gradient partial systems which lead to 1-, 2-, or 3-dimensional local encoding in the respective local coordinate system of the respective gradient partial system, depending on the overall number 1, 2 or 3 of NBSEMs and MSEMs used.

8. Magnetic resonance tomography apparatus according to claim 1, characterized in that the gradient system for local encoding can generate at least two NBSEMs with complementary field distribution, such that, in the area of local extreme values of one NBSEM, the other NBSEM has a steep and approximately linear field distribution and vice versa, such that every location within the area to be imaged is in the area of a steep and approximately linear field distribution of at least one of the used NBSEMs.

9. Magnetic resonance tomography apparatus according to claim 6, characterized in that the units generating the NBSEM are constructed such that the NBSEMs, each having a complementary field distribution, can be generated through varying the current strength and current direction in the units generating the NBSEM.

10. Magnetic resonance tomography apparatus according to claim 1, characterized in that an NBSEM may be generated whose associated gradient field has an approximately radial geometry, i.e. is oriented towards a center.

11. Magnetic resonance tomography apparatus according to claim 1, characterized in that an NBSEM may be generated whose associated gradient field has an approximately tangential geometry, i.e. is oriented perpendicular with respect to a center direction at least in partial areas.

12. Magnetic resonance tomography apparatus according to claim 1, characterized in that the units generating the NBSEM are arranged such that local magnetic fields of a pseudo Bessel geometry may be generated.

13. Magnetic resonance tomography apparatus according to claim 1, characterized in that each receiver coil has a sensitivity that significantly differs from zero in only one of the ng partial areas, and has a negligible sensitivity in the other partial areas.

14. Method for obtaining an image with magnetic tomography apparatus comprising generating transverse magnetization by at least one RF pulse with a frequency that corresponds to the Larmor frequency of the spins under investigation, said transverse magnetization being locally encoded in at least one dimension through application of at least one spatially varying and optionally time-varying magnetic field in an area of a test sample to be imaged, wherein at least one non-bijective spatially varying magnetic field defined as NBSEM or ambivalent/non-bijective spacially encoding magnetic field is applied for local encoding, in order that the function of the field strength of such an NBSEM has at least one local extreme value, a maximum or a minimum within the area to be imaged, in order that the area to be imaged is divided, along the hyper surface formed by the entirety of local extreme values of the at least one NBSEM, into ng partial areas, with n≧2, wherein the magnetic field profile has a non-unidirectional distribution within and/or over these partial areas, that the signal is read-out using at least ng receiver coils, which have a different sensitivity in the ng partial areas, and that the acquired data is uniquely allocated with respect to the location in the area to be imaged using algorithms of parallel reconstruction.

15. Method according to claim 14, characterized in that the NBSEM is used in a method based on local encoding in accordance with n-dimensional Fourier transformation.

16. Method according to claim 14, characterized in that NBSEMs are applied which are utilized to reconstruct the image in accordance with one of the methods for 2- or 3-dimensional local encoding according to the filtered back projection method.

17. Method according to claim 14, characterized in that at least one further NBSEM is used for further local encoding within the area to be imaged, in particular wherein the local field gradients of all NBSEMs are approximately perpendicular relative to each other at every location of the area to be imaged.

18. Method according to claim 14, characterized in that a conventional gradient corresponding to a monotonically spatially varying magnetic field defined as MSEM or monotonic spacially encoding magnetic field is applied in at least one further local direction for further local encoding in this local direction in the area to be imaged, wherein the MSEM has a monotonic field strength distribution in its associated local direction in the area to be imaged.

19. Method according to claim 14, characterized in that the partial images which are separately reconstructed for each partial area are transferred into a common, consistent coordinate system, taking into consideration the known geometry and imaging parameters in each partial area.

20. Method according to claim 14, characterized in that the ng local magnetic fields generated by the NBSEM differ in at least two of the ng partial areas, in particular, in view of strength and/or the respective geometrical arrangement as regards direction and/or location.

21. Method according to claim 14, characterized in that at least one NBSEM has a bimodal field distribution for local encoding, wherein the partial images acquired using this bimodal field distribution have an almost mirror-symmetrical geometry and are distinguished in correspondence with the different sensitivity profiles of the applied receiver coils.

22. Method according to claim 14, characterized in that at least two NBSEMs with complementary field distribution are used for local encoding, such that in the region of local extreme values of one NBSEM, the other NBSEM has a steep and approximately linear field distribution, and vice versa, and wherein the data is acquired with each of the two complementary NBSEMs in separate acquisition steps.

23. Method according to claim 14, characterized in that an NBSEM is used whose associated gradient field extends orthogonally or approximately orthogonally to the curved surface of the test sample.

24. Method according to claim 14, characterized in that an NBSEM is used whose associated gradient field extends parallel or approximately parallel to the curved surface of the test sample.

\* \* \* \* \*